(12) United States Patent
Shibata

(10) Patent No.: US 9,558,828 B2
(45) Date of Patent: Jan. 31, 2017

(54) SEMICONDUCTOR MEMORY DEVICE INCLUDING A NAND STRING

(71) Applicant: KABUSHIKI KAISHA TOSHIBA, Minato-ku, Tokyo (JP)

(72) Inventor: Noboru Shibata, Kawasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/950,775

(22) Filed: Nov. 24, 2015

(65) Prior Publication Data
US 2016/0078941 A1 Mar. 17, 2016

Related U.S. Application Data

(63) Continuation of application No. 14/023,202, filed on Sep. 10, 2013, now Pat. No. 9,224,476.

(30) Foreign Application Priority Data

Dec. 27, 2012 (JP) ................................. 2012-286092

(51) Int. Cl.
G11C 16/04 (2006.01)
G11C 11/56 (2006.01)
G11C 16/10 (2006.01)

(52) U.S. Cl.
CPC ....... *G11C 16/0483* (2013.01); *G11C 11/5628* (2013.01); *G11C 16/10* (2013.01);
(Continued)

(58) Field of Classification Search
CPC .................................................. G11C 16/0483
(Continued)

(56) References Cited

U.S. PATENT DOCUMENTS 5,969,990 A * 10/1999 Arase ........................ G11C 7/18
257/E27.103
6,058,044 A 5/2000 Sugiura et al.
(Continued)

FOREIGN PATENT DOCUMENTS

CN 101060013 A 10/2007
CN 102203878 A 9/2011

OTHER PUBLICATIONS

English translation of Japanese Office Action dated Dec. 15, 2015, issued in counterpart Japanese Application No. 2012-286092.
(Continued)

*Primary Examiner* — Hoai V Ho
(74) *Attorney, Agent, or Firm* — Holtz, Holtz & Volek PC

(57) ABSTRACT

A semiconductor memory device includes a first NAND string and a second NAND string are connected to a bit line. One of the first and second NAND strings is selected by first to fourth select memory cells. At the write time, data is written in a first memory cell of the first NAND string selected by of the first to fourth select memory cells, then data is written in a second memory cell of the second NAND string selected at the same time as the first memory cell, data is written in a third memory cell adjacent to the first memory cell of the first NAND string and finally data is written in a fourth memory cell of the second NAND string selected at the same time as the third memory cell.

4 Claims, 19 Drawing Sheets

(52) U.S. Cl.
CPC .......... *G11C 2211/5621* (2013.01); *G11C 2211/5648* (2013.01)

(58) Field of Classification Search
USPC .................................................. 365/185.17
See application file for complete search history.

(56) References Cited

U.S. PATENT DOCUMENTS

| 8,520,448 | B1 | 8/2013 | Lutze et al. |
| 2004/0170056 | A1 | 9/2004 | Shibata et al. |
| 2006/0023505 | A1 | 2/2006 | Iizuka |
| 2007/0036000 | A1* | 2/2007 | Kutsukake ......... G11C 16/3468 365/185.17 |
| 2007/0147141 | A1 | 6/2007 | Shibata |
| 2009/0316478 | A1 | 12/2009 | Kutsukake |
| 2010/0097862 | A1 | 4/2010 | Kang et al. |
| 2010/0110792 | A1 | 5/2010 | Lutze et al. |
| 2010/0118606 | A1 | 5/2010 | Lee et al. |
| 2013/0114345 | A1 | 5/2013 | Lee |

OTHER PUBLICATIONS

Japanese Office Action dated Dec. 15, 2015, issued in counterpart Japanese Application No. 2012-286092.
Chinese Office Action dated Apr. 27, 2016 (and English translation thereof), issued in counterpart Chinese Application No. 201310375757.4.
Taiwanese Office Action dated May 25, 2015, issued in counterpart Taiwanese Application No. 102126368.

* cited by examiner

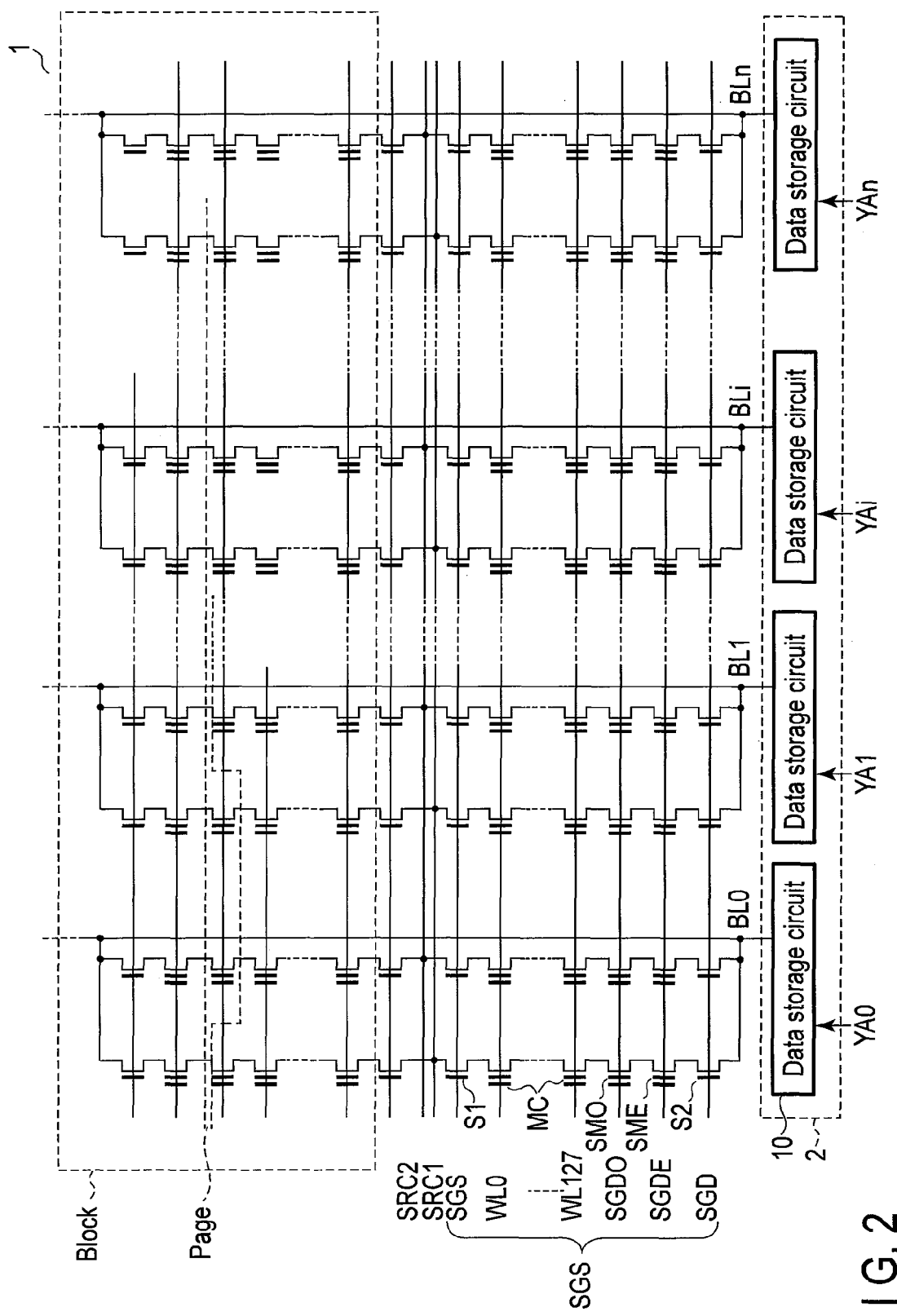
F I G. 2

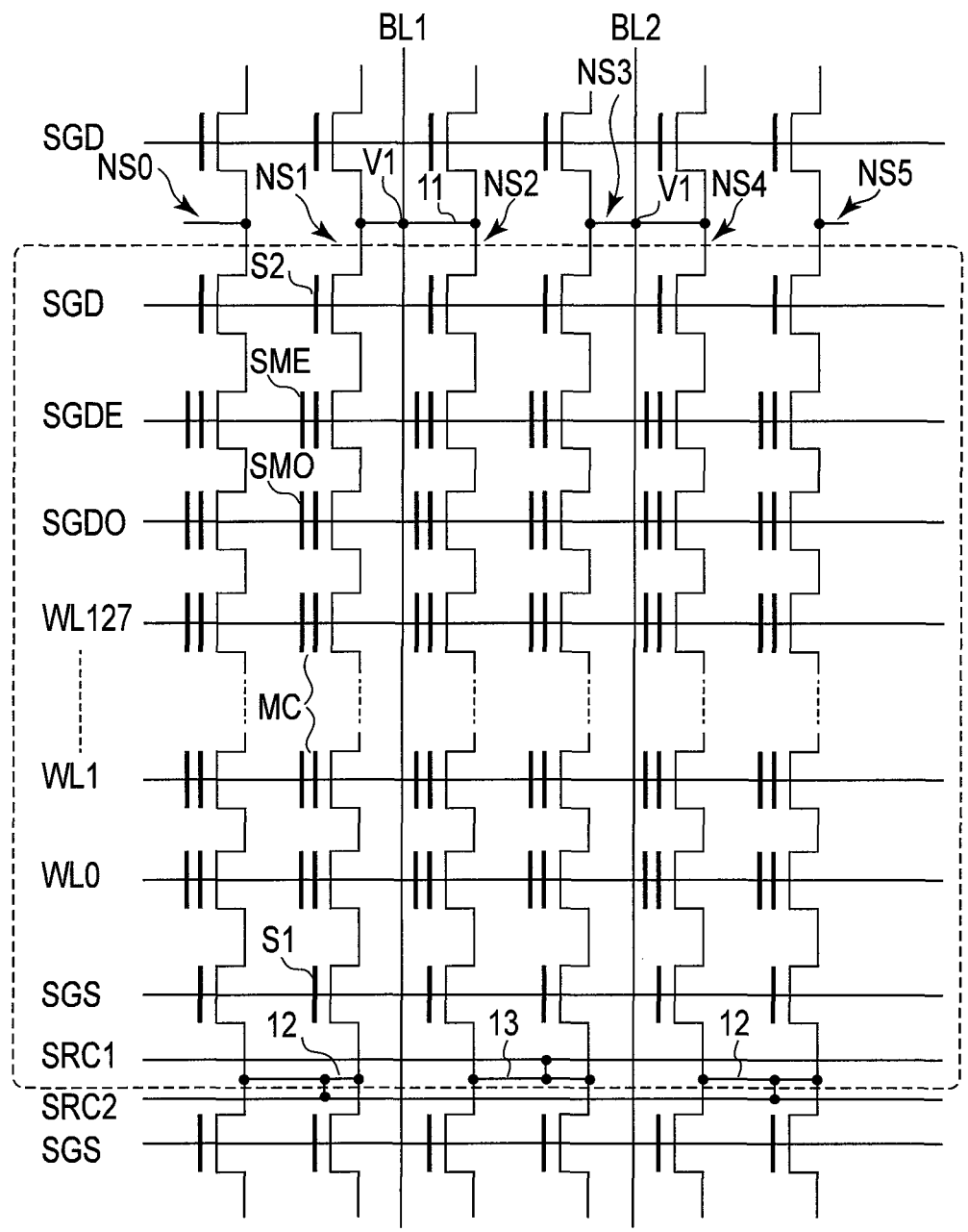
F I G. 3

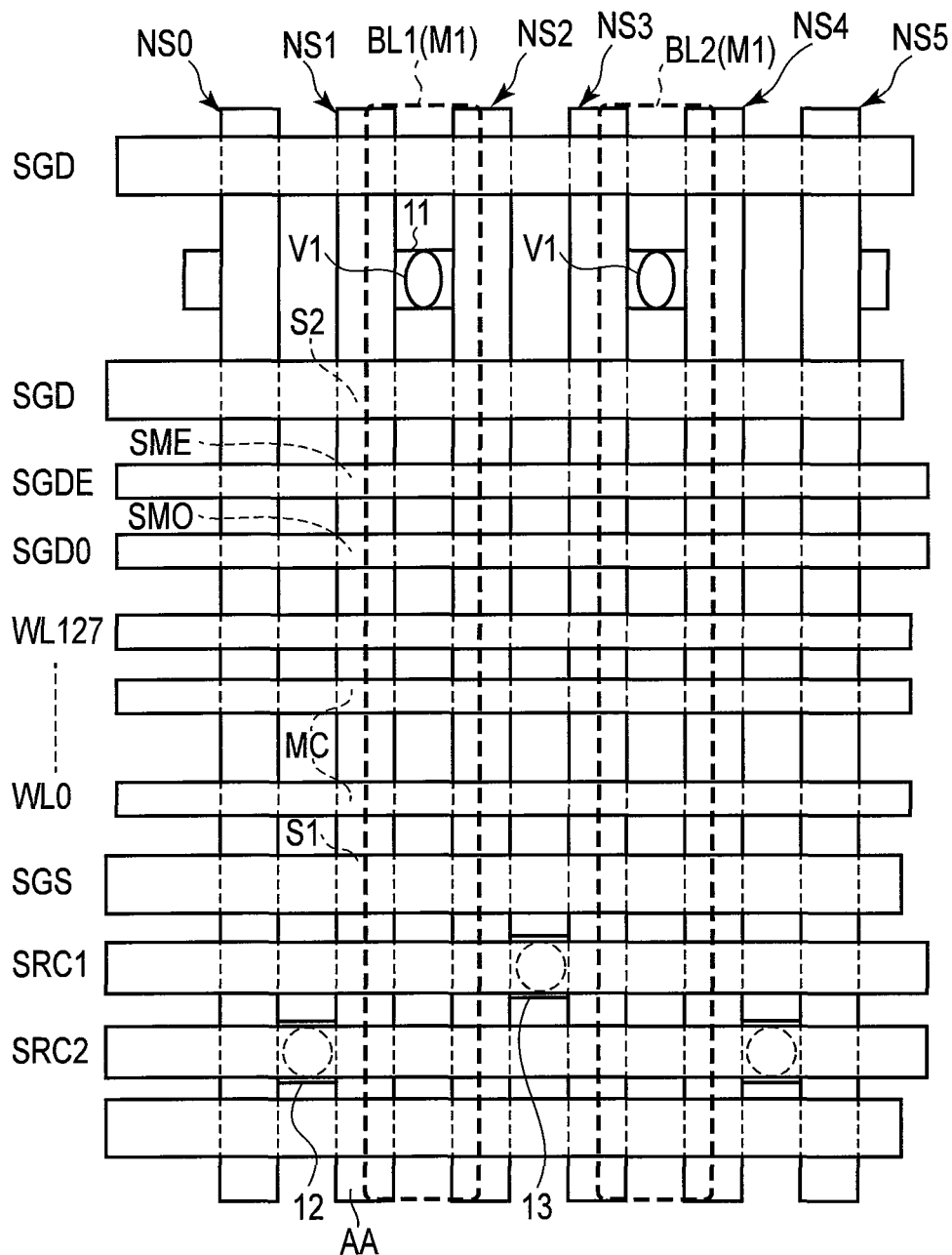
F I G. 4

| | Cell (P-Well) | Cell (N-Well) | H. V. Tr (P-sub) | L. V. Nch (P-Well) | L. V. Pch (N-Well) | H. V. Pch (N-Well) |
|---|---|---|---|---|---|---|
| Erase | Vera (20V) | Vera (20V) | Vss (0V) | Vss (0V) | Vdd (2.5V) | Vdd (2.5V) |
| Prog | Vss (0V) | Vss (0V) | Vss (0V) | Vss (0V) | Vdd (2.5V) | Vdd (2.5V) /Vpgmh |
| Read | Vss (0V) | Vss (0V) | Vss (0V) | Vss (0V) | Vdd (2.5V) | Vdd (2.5V) /Vreadh |

F I G. 7

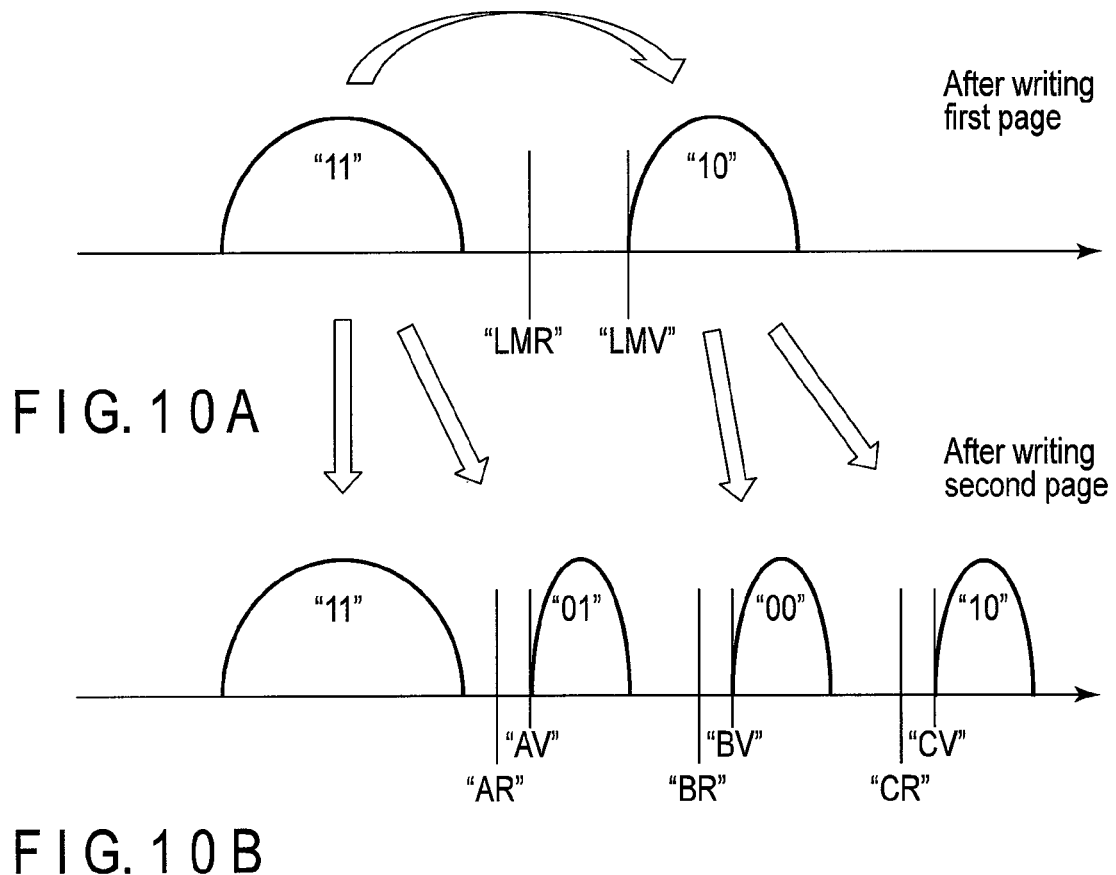
FIG. 10A
FIG. 10B
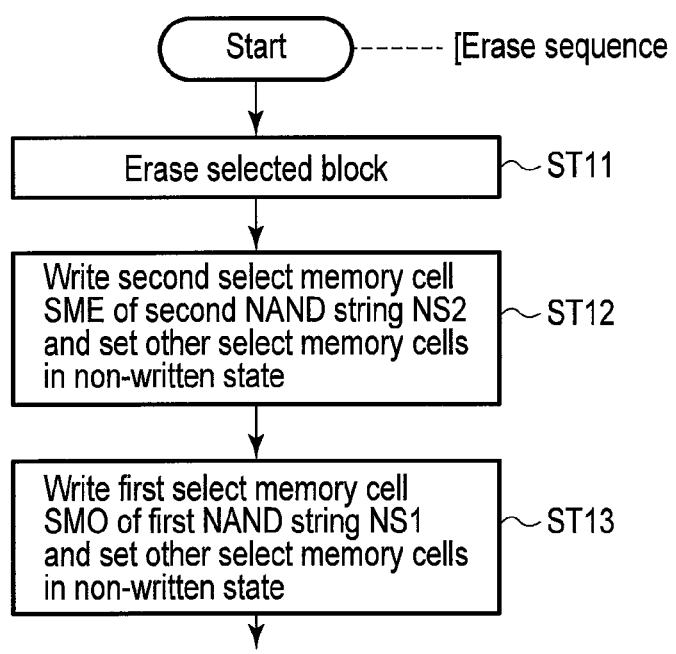
FIG. 11

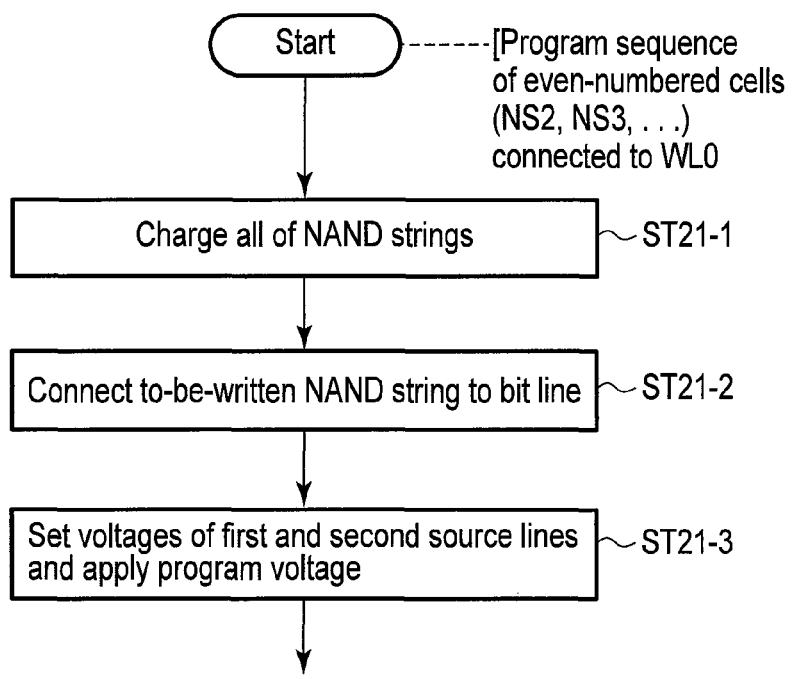
F I G. 14
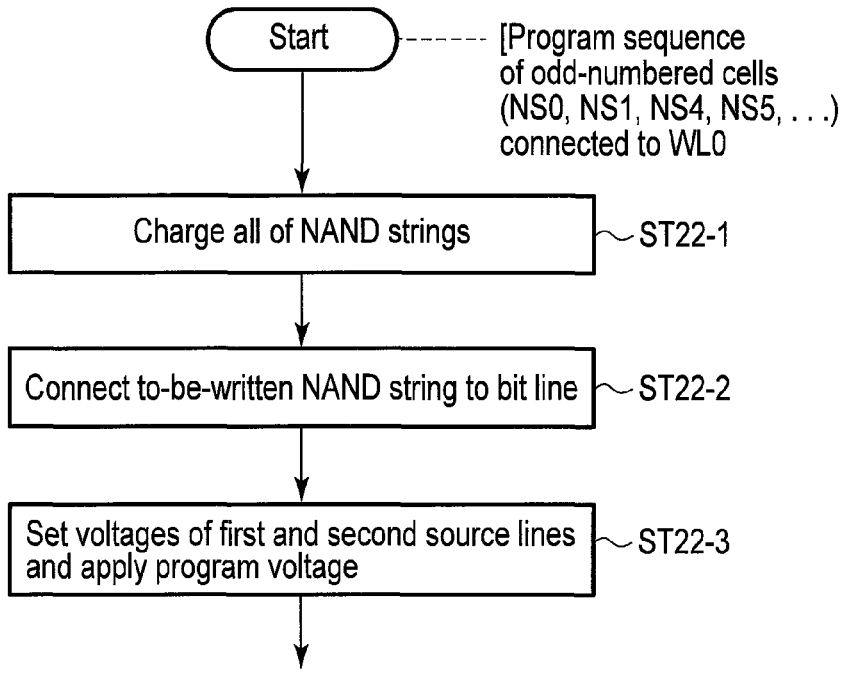
F I G. 15

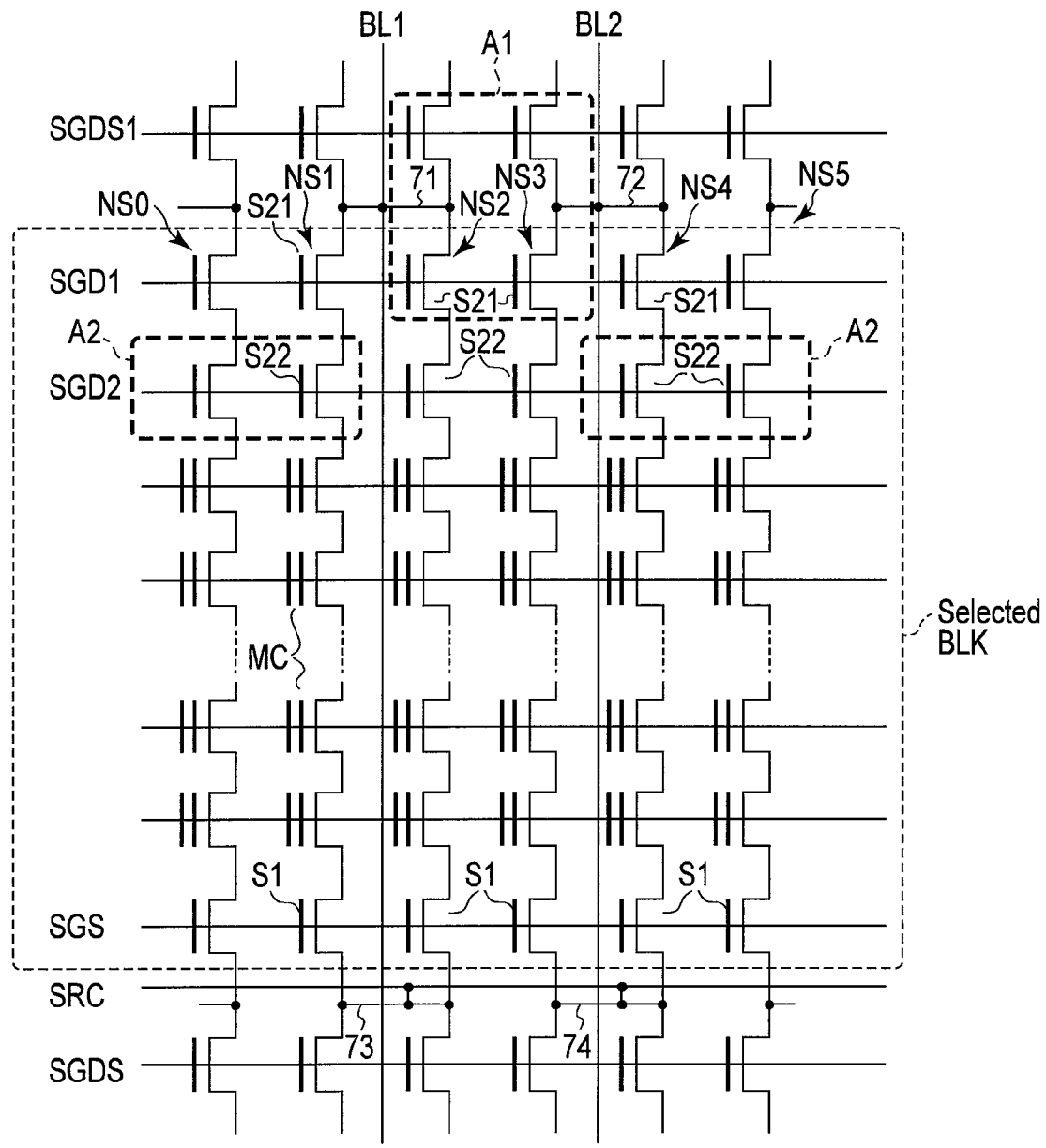
F I G. 19

SEMICONDUCTOR MEMORY DEVICE INCLUDING A NAND STRING

CROSS-REFERENCE TO RELATED APPLICATIONS

This application is a Continuation application of U.S. Ser. No. 14/023,202, filed Sep. 10, 2013, which is based upon and claims the benefit of priority from Japanese Patent Application No. 2012-286092, filed Dec. 27, 2012, the entire contents of both of which are incorporated herein by reference.

FIELD

Embodiments described herein relate generally to a semiconductor memory device, for example, a NAND flash memory capable of storing binary and multi-valued data.

BACKGROUND

A NAND flash memory has a plurality of memory cells arranged in a row direction and connected to a write and read latch circuit via bit lines and data is simultaneously written or read with respect to the memory cells arranged in the row direction.

Further, in the NAND flash memory, the source and drain diffusion layers of a plurality of memory cells arranged in a column direction are serially connected to configure a NAND string and the NAND string is connected to a bit line through a via.

However, recently, it becomes more difficult to form vias used for connecting the NAND strings to the bit lines as a device becomes more miniaturized.

BRIEF DESCRIPTION OF THE DRAWINGS

FIG. 2 is a circuit diagram showing one example of the configuration of a memory cell array and bit line control circuit shown in FIG. 1.

FIG. 3 is a circuit diagram showing an extracted portion of the memory cell array shown in FIG. 2.

FIG. 4 is a plan view showing a pattern of the circuit shown in FIG. 3.

FIG. 7 is a diagram showing voltages at respective portions at the time of erase, program and read in FIG. 6.

FIGS. 10A and 10B are diagrams schematically showing variations in the threshold voltage level to be written in the memory cell.

FIG. 11 is a flowchart for illustrating an erase sequence according to the first embodiment.

FIG. 14 is a flowchart for illustrating a write sequence for even-numbered memory cells connected to a word line.

FIG. 15 is a flowchart for illustrating a write sequence for odd-numbered memory cells connected to the word line.

FIG. 19 is a circuit diagram showing an extracted portion of a memory cell array according to a third embodiment.

DETAILED DESCRIPTION

In general, according to one embodiment, a semiconductor memory device includes a first NAND string, a second NAND string, a bit line, a first source line, a second source line, and a plurality of word lines. The second NAND string includes a plurality of memory cells and first and second select memory cells whose source and drain are serially connected. The first NAND string includes a plurality of memory cells, a third select memory cell that is selected at the same time as the first select memory cell and has a threshold voltage different from that of the first select memory cell and a fourth select memory cell that is selected at the same time as the second select memory cell and has a threshold voltage different from that of the second select memory cell, the source and drain thereof being serially connected. The bit line is arranged in correspondence to the first and second NAND strings. The first source line is connected to the second NAND string. The second source line is connected to the first NAND string. The plural word lines are used to select plural memory cells that are arranged in a row direction among the plurality of memory cells. At the write time, data is written in a first memory cell of the first NAND string selected by the first to fourth select memory cells, then data is written in a second memory cell of the second NAND string selected at the same time as the first memory cell, data is written in a third memory cell adjacent to the first memory cell of the first NAND string and finally data is written in a fourth memory cell of the second NAND string selected at the same time as the third memory cell.

Next, embodiments are explained with reference to the accompanying drawings.

First Embodiment

Figure 1:
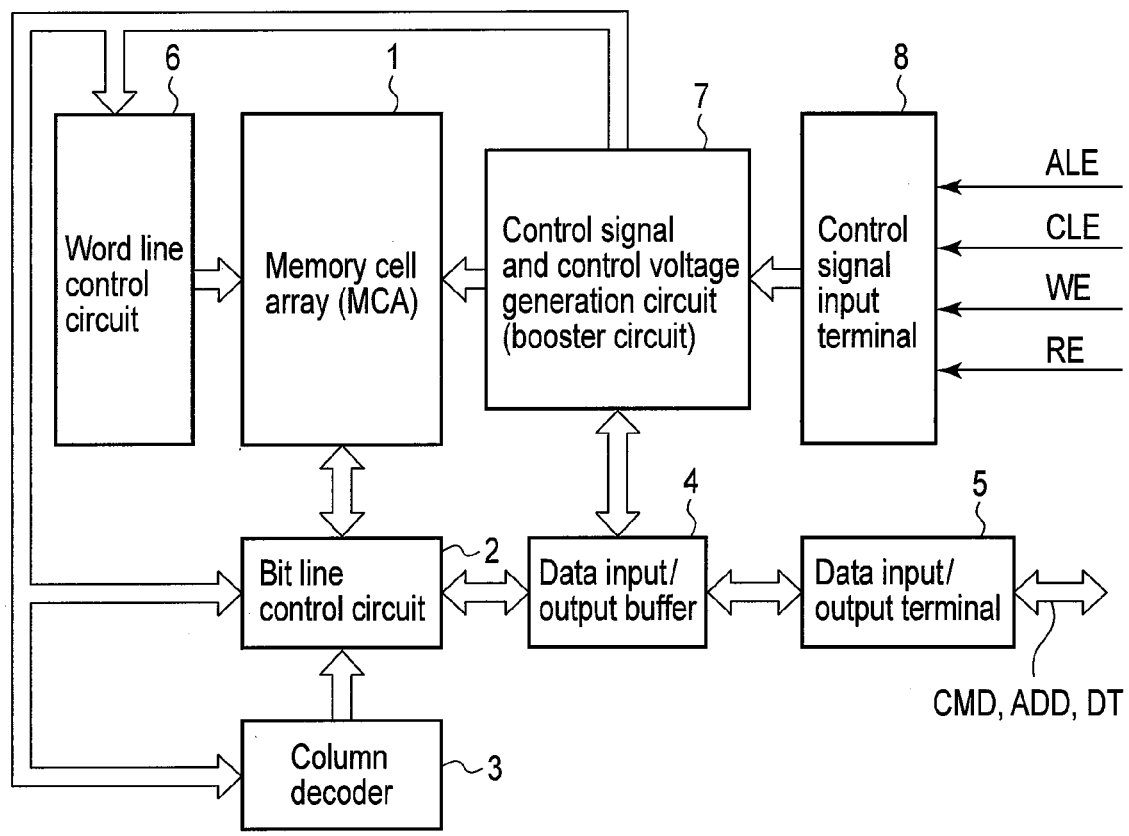
FIG. 1 is a configuration diagram showing one example of a NAND flash memory used as a semiconductor memory device that is applied to one embodiment.

FIG. 1 shows the configuration of a semiconductor memory device according to a first embodiment and shows a NAND flash memory in which four values (two bits) are stored in one memory cell, for example.

A memory cell array 1 includes a plurality of bit lines, a plurality of word lines and a common source line and, for example, electrically data reprogrammable memory cells each formed of an EEPROM cell are arranged in a matrix form therein. A bit line control circuit 2 for controlling the bit lines and a word line control circuit 6 are connected to the memory cell array 1.

The bit line control circuit 2 reads data of a memory cell in the memory cell array 1 via the bit line, detects the state of a memory cell in the memory cell array 1 via the bit line and applies a write control voltage to a memory cell in the memory cell array 1 via the bit line to write data in the memory cell. The bit line control circuit 2 is connected to a column decoder 3 and data input/output buffer 4. One of data storage circuits in the bit line control circuit 2 is selected by the column decoder 3. Data of a memory cell read to the data storage circuit is output to the exterior from a data input/output terminal 5 via the data input/output buffer 4. The data input/output terminal 5 is connected to a host (not shown) provided outside the memory chip. The host is configured by, for example, a microcomputer and receives data output from the data input/output terminal 5. Further, the host outputs various types of commands CMD for controlling the operation of the NAND flash memory, address ADD and data DT. Write data input from the host to the data input/output terminal 5 is supplied to the data storage circuit selected by the column decoder 3 via the data input/output buffer 4 and the command and address are supplied to a control signal and control voltage generation circuit 7.

The word line control circuit 6 is connected to the memory cell array 1. The word line control circuit 6 selects a word line in the memory cell array 1 and applies a voltage required for reading, writing or erasing to the selected word line.

The memory cell array 1, bit line control circuit 2, column decoder 3, data input/output buffer 4 and word line control circuit 6 are connected to the control signal and control voltage generation circuit 7 and are controlled by the control signal and control voltage generation circuit 7. The control signal and control voltage generation circuit 7 is connected to a control signal input terminal 8 and is controlled by control signals ALE (Address Latch Enable), CLE (Command Latch Enable), WE (Write Enable) and RE (Read Enable) input from the host via the control signal input terminal 8. The control signal and control voltage generation circuit 7 generates voltages of the word lines and bit lines at the data write time and generates a voltage supplied to a well as will be described later. The control signal and control voltage generation circuit 7 includes, for example, a booster circuit such as a charge pump circuit and is designed to generate voltages such as a program voltage, read voltage and erase voltage.

The bit line control circuit 2, column decoder 3, word line control circuit 6 and control signal and control voltage generation circuit 7 configure a write circuit and read circuit.

FIG. 2 shows one example of the configuration of the memory cell array 1 and bit line control circuit 2 shown in FIG. 1. The memory cell array 1 includes a plurality of NAND strings NS. Adjacent NAND strings, for example, two NAND strings are connected to a corresponding one of bit lines BL0, BL1, Bli, BLn. Bit lines BL0, BL1, Bli, BLn are respectively connected to data storage circuits 10 that configure the bit line control circuit 2. Each data storage circuit 10 is supplied with an address signal (YA0, YA1, YAi, YAn).

For example, each NAND string NS is configured by serially connecting 128 memory cells MC, first select memory cell SMO, second select memory cell SME and select gates S1, S2. Each of memory cells MC, first select memory cell SMO and second select memory cell SME is configured by an EEPROM, for example. Select gate S2 is connected to bit line BL0 (BL1, BLi, BLn) and select gate S1 is connected to first source line SRC1 (or second source line SRC2).

The control gates of memory cells MC arranged on each row are commonly connected to a corresponding one of word lines WL0 to WL127. The control gate of first select memory cell SMO is connected to select line SGDO and the control gate of second select memory cell SME is connected to select line SGDE. Further, select gates S2 are commonly connected to select line SGD and select gates S1 are commonly connected to select line SGS.

As indicated by broken lines, the memory cell array 1 includes a plurality of blocks. Each block is configured by a plurality of NAND strings NS and, for example, data is erased in the block unit.

One of two NAND strings NS connected to one bit line is selected by first and second select memory cells SMO and SME and is connected to the bit line. In one of NAND strings NS connected to one bit line, a plurality of memory cells (memory cells in a range surrounded by broken lines) connected to one word line configure one page and a plurality of remaining memory cells connected to one word line also configure one page in the other NAND string.

The data writing and reading operations are performed for each page. That is, at the data write or read operation time, half of the memory cells among the plurality of memory cells arranged in the row direction are connected to a corresponding bit line. Therefore, the write or read operation is performed for each half of the plurality of memory cells arranged in the row direction.

In the write or read operation, bit lines BL0o, BL1o, BLio, BLno connected to the data storage circuits 10 are selected according to addresses (YA0, YA1, YAi, YAn).

The data write or read operation is performed in the page unit. When one bit is stored in one cell, one page is used, when two bits are stored in one cell, two pages are used, when three bits are stored in one cell, three pages are used and when four bits are stored in one cell, four pages are used. The page is switched according to an address.

FIG. 3 shows a portion of the memory cell array 1 shown in FIG. 2 and FIG. 4 shows a pattern of the circuit shown in FIG. 3. The configurations of NAND strings NS1, NS2 connected to bit line BL1, for example, are further explained with reference to FIG. 3 and FIG. 4. The configurations of the other NAND strings are the same as those of NAND strings NS1, NS2.

Each of NAND strings NS1, NS2 is configured by, for example, serially connecting the source and drain (AA) of 128 memory cells, first select memory cell SMO, second select memory cell SME and select gates S1, S2. The drain of select gates S2 of NAND strings NS1, NS2 are connected by a connecting portion 11 and the connecting portion 11 is connected to bit line BL1 through via (or contact plug) V1. That is, bit line BL1 is connected to first and second NAND strings NS1, NS2 through via V1 in the connecting portion 11. For example, bit line BL1 is formed of a first-layered metal wiring layer (M1).

Further, the source of select gate S1 of NAND string NS1 is connected to the source of select gate S1 of NAND string NS0 via a connecting portion 12 and the connecting portion 12 is connected to second source line SRC2. Further, the source of select gate S1 of NAND string NS2 is connected to the source of select gate S1 of NAND string NS3 via a connecting portion 13 and the connecting portion 13 is connected to first source line SRC1.

Figure 5A:
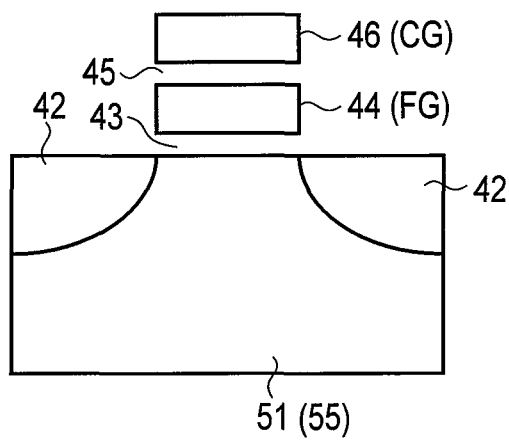
FIG. 5A is a cross-sectional view of a memory cell and FIG. 5B is a cross-sectional view of a select gate.
Figure 5B:
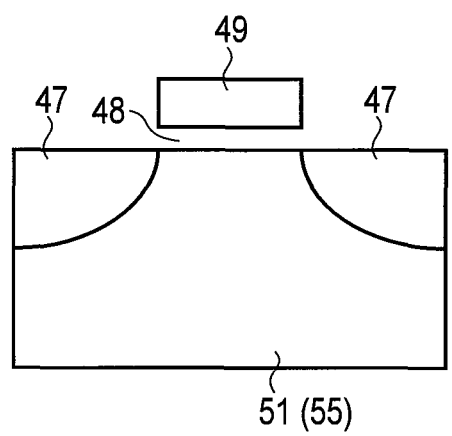

FIG. 5A is a cross-sectional view of memory cell MC, first and second select memory cells SMO, SME and FIG. 5B is a cross-sectional view of select gate S1, S2. As shown in FIG. 5A, first and second select memory cells SMO, SME have the same structure as that of memory cell MC that stores data. However, the size of first and second select memory cells SMO, SME may be set larger than that of memory cell MC to attain the higher reliability in comparison with that of memory cell MC. Further, dummy cells may be arranged between select gates S1, S2 and first and second select memory cells SMO, SME and between first and second select memory cells SMO, SME and memory cell MC.

Figure 6:
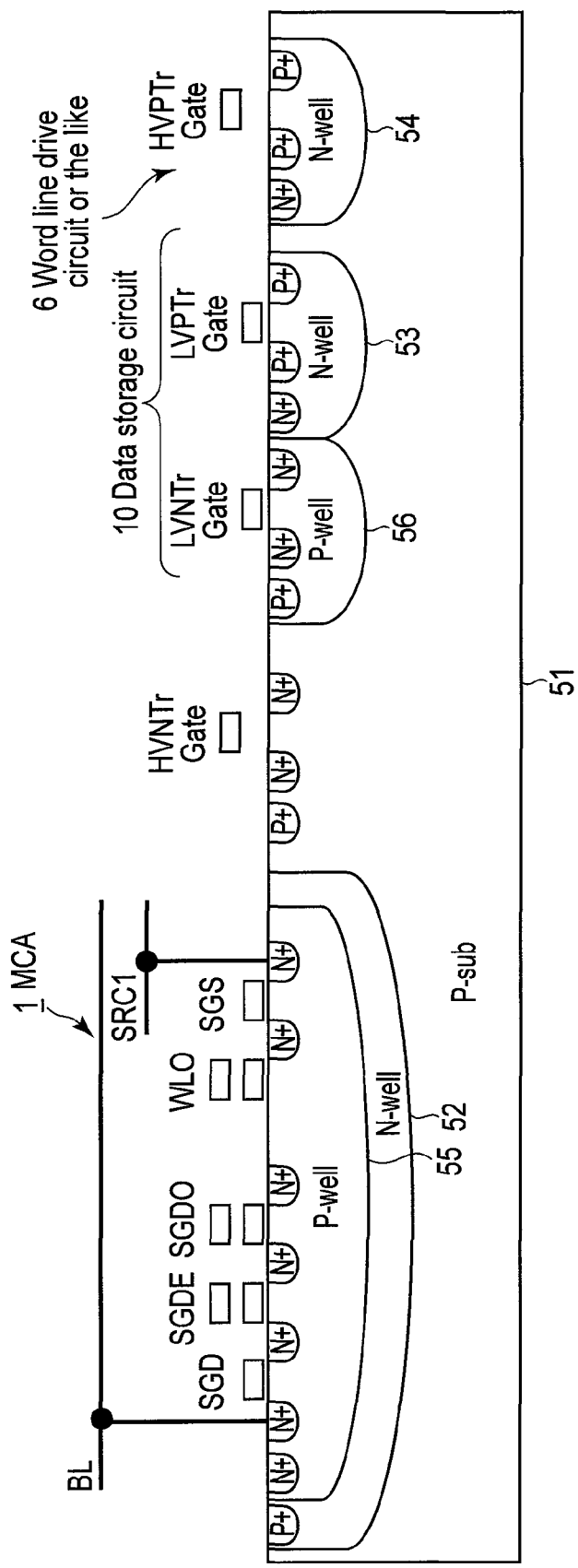
FIG. 6 is a cross-sectional view of a semiconductor memory device corresponding to the first embodiment.

FIG. 6 is a cross-sectional view of the NAND flash memory. For example, N-type well regions 52, 53, 54 and P-type well 56 are formed in a P-type semiconductor substrate 51. A P-type well region 55 is formed in the N-type well region 52 and low-voltage N-channel transistor LVNTr that configures the memory cell array 1 is formed in the P-type well region 55. Further, low-voltage P-channel transistor LVPTr and low-voltage N-channel transistor LVNTr that configure the data storage circuit 10 are respectively formed in N-type well region 53 and P-type well region 56. Additionally, high-voltage N-channel transistor HVNTr that connects the bit line to the data storage circuit 10 is formed in the substrate 51. Further, high-voltage P-channel transistor HVPTr that configures a word line drive circuit or the like, for example, is formed in the N-type well region 54. As shown in FIG. 6, high-voltage transistors HVNTr, HVPTr have gate insulating films thicker than those of low-voltage transistors LVNTr, LVPTr, for example.

In FIG. 6, second source line SRC2 is omitted.

FIG. 7 shows an example of voltages supplied to respective regions shown in FIG. 6. Voltages shown in FIG. 7 are supplied to the respective regions in the erase, write (or program) and readout (also read) operations. In this case, Vera indicates a voltage applied to the substrate at the data erase time, Vss is a ground voltage, and Vdd is a power source voltage. Further, Vpgmh is a voltage applied to the gate of the N-channel MOS transistor in the row decoder at the data write time and is set to a potential that permits write voltage Vpgm of the word line to be passed without being lowered by the threshold voltage of the N-channel MOS transistor. That is, Vpgmh is voltage (Vpgm+Vth (Vth: the threshold voltage of the N-channel MOS transistor)) supplied to the word line. Vreadh is a voltage applied to the gate of the N-channel MOS transistor in the row decoder at the data read time and is set to a potential that permits Vread to be passed without being lowered by the threshold voltage of the N-channel MOS transistor. That is, Vreadh is a voltage supplied to the word line and is set to (Vread+Vth (Vth: the threshold voltage of the N-channel MOS transistor)) at the read time.

Additionally, Vpass is provided as a voltage applied to the word line of the non-selected cell at the data write time and Vread is provided as a voltage applied to the non-selected word line at the data read time.

Figure 8:
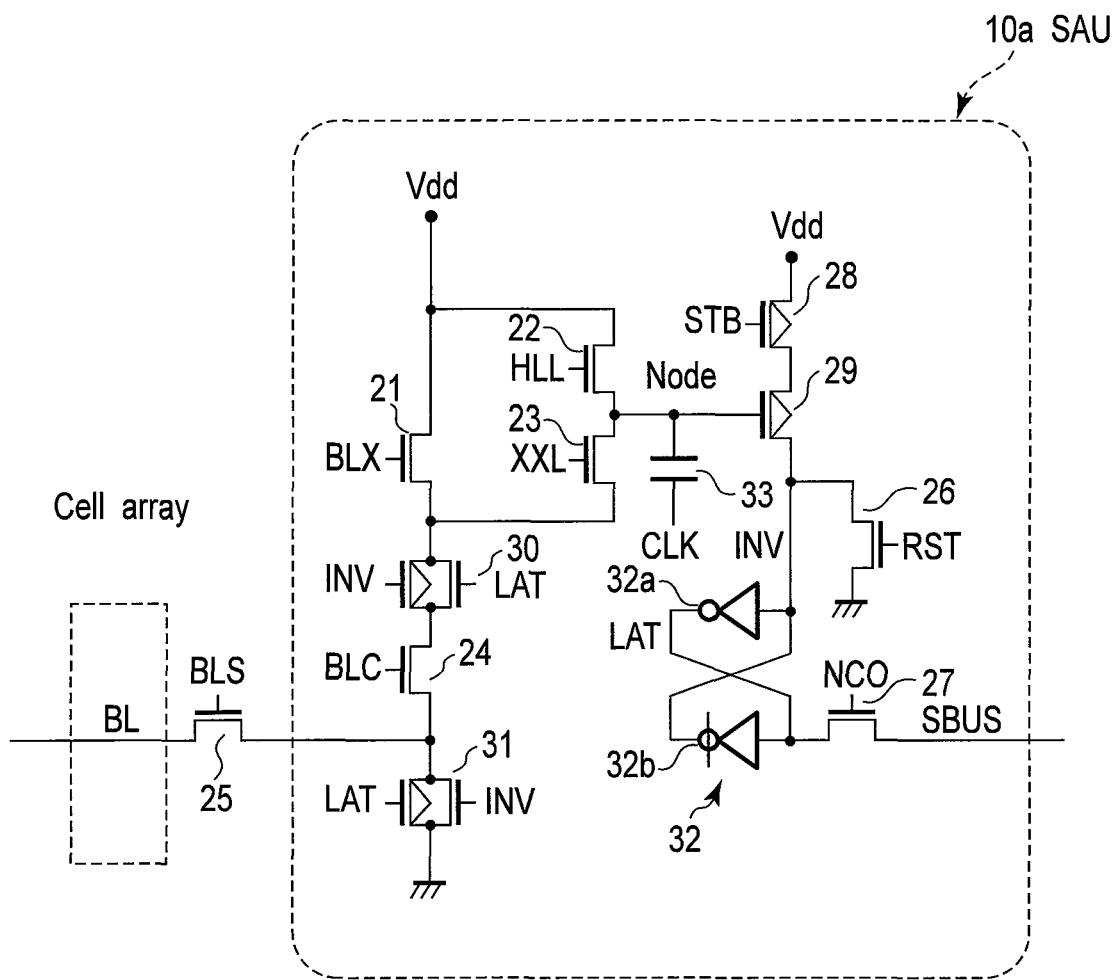
FIG. 8 is a circuit diagram showing a portion of a data storage circuit shown in FIG. 2 and showing a sense amplifier unit.
Figure 9:
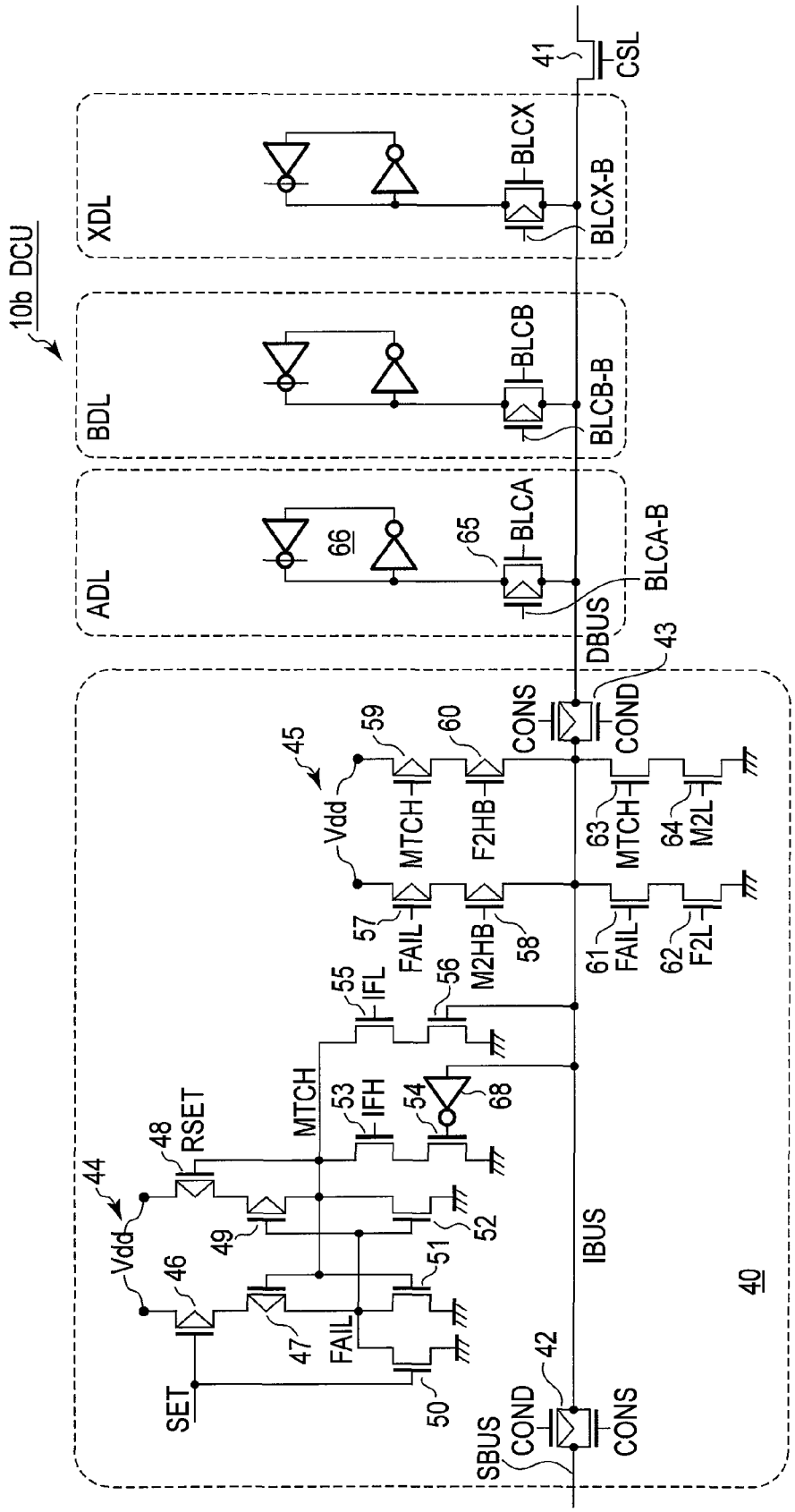
FIG. 9 is a circuit diagram showing a portion of the data storage circuit shown in FIG. 2 and showing a data control unit.

FIG. 8 and FIG. 9 each show one example of the data storage circuit 10 shown in FIG. 2. The data storage circuit 10 is configured by a sense amplifier unit (SAU) 10a shown in FIG. 8 and a data control unit (DCU) 10b shown in FIG. 9.

In FIG. 8, the sense amplifier unit 10a includes a plurality of N-channel MOS transistors (that are hereinafter referred to as NMOSs) 21 to 27, a plurality of P-channel MOS transistors (that are hereinafter referred to as PMOSs) 28, 29, transfer gates 30, 31, latch circuit 32 and capacitor 33. For example, the latch circuit 32 is configured by clocked inverter circuits 32a, 32b.

One end of the current path of NMOS 21 is connected to a node supplied with power source voltage Vdd and the other end thereof is grounded via the transfer gate 30, NMOS 24 and transfer gate 31. One end of the current path of NMOS 25 is connected to the connection node of NMOS 24 and the transfer gate 31. The other end of NMOS 25 is connected to bit line BL arranged in the memory cell array. A series circuit of NMOSs 22 and 23 is connected in parallel with NMOS 21.

Further, one end of the current path of PMOS 28 is connected to a node supplied with power source voltage Vdd and the other end thereof is connected to an input terminal of the inverter circuit 32a configuring the latch circuit 32 via PMOS 29 and grounded via NMOS 26. The input terminal of the clocked inverter circuit 32b that is cross-coupled with the inverter circuit 32a is connected to the data control unit (DCU) 10b via NMOS 27. Further, the gate of PMOS 29 is connected to a connection node of NMOSs 22 and 23 and the connection node is connected to one end of the capacitor 33. The other end of the capacitor 33 is supplied with clock signal CLK.

The gate of NMOS 21 is supplied with signal BLX. The gate of the NMOS configuring the transfer gate 30 is supplied with signal LAT of the output terminal of the inverter circuit 32a configuring the latch circuit 32 and the gate of the PMOS transistor is supplied with signal INV of the input terminal of the inverter circuit 32a. The gate of NMOS 24 is supplied with signal BLC and the gate of NMOS 25 is supplied with signal BLS.

The gate of NMOS 22 is supplied with signal HLL and the gate of NMOS 23 is supplied with signal XXL.

The gate of PMOS 28 is supplied with signal STB and the gate of NMOS 26 is supplied with reset signal RST. The gate of NMOS 27 is supplied with signal NCO.

Next, the operation of the sense amplifier unit is schematically explained.

(Write Operation)

When data is written in the memory cell, first, signal STB is set to a high level, reset signal RST is once set to the high level to reset the latch circuit 32, signal LAT is set to the high level and signal INV is set to a low level.

After this, signal NCO is set to the high level and data is fetched from the data control unit 10b. When the data is set at the low level (0) indicating writing, signal LAT is set to the low level and signal INV is set to the high level. Further, when the data is set at the high level (1) indicating non-writing, data of the latch circuit 32 is kept unchanged, signal LAT is held at the high level and signal INV is held at the low level.

Next, if signals BLX, BLC, BLS are set to the high level and when signal LAT of the latch circuit is set at the low level and signal INV is set at the high level (writing), the transfer gate 30 is turned off and the transfer gate 31 is turned on to set bit line BL to Vss. In this state, if the word line is set to program voltage Vpgm, data is written in the memory cell.

On the other hand, if signal LAT is set at the high level and signal INV is set at the low level (non-writing) in the latch circuit 32, bit line BL is charged to Vdd since the transfer gate 30 is turned on and the transfer gate 31 is turned off. Therefore, since the channel of the cell is boosted to a higher potential when the word line is set to Vpgm, data is not written in the memory cell.

(Read Operation, Program Verify Read Operation)

When data is read from the memory cell, first, set signal RST is once set at the high level to reset the latch circuit 32, signal LAT is set at the high level and signal INV is set at the low level. Then, signals BLS, BLC, BLX, HLL, XXL are set to preset voltages to charge bit line BL. At this time, Node of the capacitor 33 is charged to Vdd. In this case, if the threshold voltage of the memory cell is higher than the read level, the memory cell is set in the off state and the bit line is kept at the high level. That is, Node is kept at the high level. Further, if the threshold voltage of the memory cell is lower than the read level, the memory cell is set in the on state and charges of bit line BL are discharged. Therefore, bit line BL is set to the low level. As a result, Node is set to the low level.

Next, since Node is set at the Level if signal STB is set to the low level and when the memory cell is kept on, PMOS 29 is turned on, signal INV of the latch circuit 32 is set to the high level and signal LAT is set to the low level. On the other hand, if the memory cell is kept off, signal INV of the latch circuit 32 is set to the low level and signal LAT is kept at the high level.

After this, if signal NCO is set to the high level, NMOS 27 is turned on and data of the latch circuit 32 is transferred to the data control unit 10b.

After the write operation, the program verify operation for verifying the threshold voltage of the memory cell is performed substantially similarly to the read operation.

FIG. 9 shows one example of the data control unit (DCU) 10b.

The data control unit 10b shown in FIG. 9 includes an operation circuit 40, a plurality of data latch circuits ADL, BDL, XDL and NMOS 41.

The operation circuit 40 includes a bus (that is hereinafter referred to as IBUS), transfer gates 42, 43 connected to both ends of the IBUS and operated in a complementary fashion, a latch circuit 44 that latches data of the IBUS and a setting circuit 45 that sets the levels of the data latch circuits ADL, BDL, XDL according to the data of the latch circuit 44.

The transfer gate 42 is operated according to complementary signals COND and CONS and connects the bus (that is expressed as SBUS) of the sense amplifier unit SAU 10a to the IBUS. The transfer gate 43 is operated according to complementary signals COND and CONS and connects the IBUS to the bus (that is hereinafter referred to as DBUS) to which data latch circuits ADL, BDL, XDL are connected. When the transfer gate 42 is set on, the transfer gate 43 is set off, and when the transfer gate 42 is set off, the transfer gate 43 is set on.

The latch circuit 44 includes a plurality of PMOSs 46 to 49, a plurality of NMOSs 50 to 56 and inverter circuit 68. The gates of PMOS 46 and NMOS 50 are supplied with set signal SET and the gate of PMOS 48 is supplied with reset signal REST. The gate of NMOS 53 is supplied with signal IFH and the gate of NMOS 55 is supplied with signal IFL. The gate of NMOS 54 is connected to the IBUS via the inverter circuit 68 and the gate of NMOS 56 is connected to the IBUS.

The setting circuit 45 includes PMOSs 57 to 60 and NMOSs 61 to 64. The gates of PMOS 57 and NMOS 61 are supplied with signal FAIL. Signal FAIL is a signal of a connection node of PMOS 47 and NMOS 51 used as one of the output terminals of the latch circuit 44. The gates of PMOS 59 and NMOS 63 are supplied with signal MTCH. Signal MTCH is a signal of a connection node of PMOS 49 and NMOS 52 used as the other output terminal of the latch circuit 44. Further, the gate of PMOS 58 is supplied with signal M2HB and the gate of PMOS 60 is supplied with signal F2HB. The gate of NMOS 62 is supplied with signal F2L and the gate of NMOS 64 is supplied with signal M2L.

Data latch circuits ADL, BDL, XDL have the same configuration and each include a latch circuit 66 and a transfer gate 65 that connects the latch circuit 66 to the DBUS. The transfer gates 65 are controlled by signals BLCA, BLCA_B, signals BLCB, BLCB_B and signals BLCX, BLCX_B. Data latch circuit XDL is connected to an external IO via NMOS 41. The gate of NMOS 41 is supplied with signal CSL.

As described before, the data control unit 10b holds write data and holds data read from the memory cell at the read time.

For example, 2-bit write data supplied from the data input/output buffer 4 is latched for each bit in, for example, data latch circuits ADL, BDL via data latch circuit XDL.

The operation circuit 40 shown in FIG. 9 can perform the operation of AND, OR, exclusive NOR and the like with respect to data of data latch circuits ADL, BDL. For example, in the case of the AND operation, data held in data latch circuits ADL, BDL is output to DBUS and IBUS. In this case, IBUS is set to the high level only if data items held in data latch circuits ADL, BDL are both 1 and is set to the low level in the other cases. That is, IBUS becomes 1 only at the non-written time and IBUS becomes 0 at the written time. The data is transferred to the sense amplifier unit 10a shown in FIG. 8 via SBUS to perform the write operation.

The operation of the operation circuit 40 can be variously modified and, for example, various control methods can be applied to one logical operation and the control method can be changed as required.

FIGS. 10A and 10B show data, threshold voltages, verify levels and read levels of memory cells after data items of two bits and four values are written in the first and second pages.

As shown in FIG. 10A, data of the memory cell is set to a threshold voltage of 11 by the erase operation. If data of the first page is written, the memory cell is kept in the erase state or level LMV is written therein and data of the memory cell is set to a threshold voltage of 11 or 10.

As shown in FIG. 10B, if data of the second page is written, one of the levels of AV, BV and CV is written in the memory cell while the memory cell is kept in the erase state, and data of the memory cell is set to a threshold voltage of 11, 01, 00, 10. The verify level at the write time is set at a level slightly higher than the level at the read time since it is required to provide a data retention margin. In FIGS. 10A and 10B, the read level is expressed by LMR, AR, BR, CR and the verify read level is expressed by LMV, AV, BV, CV.

(Erase Sequence)

The erase sequence in the present embodiment is explained with reference to FIG. 11 and FIG. 12.

In the erase operation, first, word lines WL0 to WL127 of a selected block (BLK) and select lines SGDO, SGDE connected to the first and second select memory cells are set to 0 V, the word lines of non-selected blocks and select lines SGDO, SGDE are made to float and the well having the memory cell array 1 formed therein is set to erase voltage VERA. As a result, the memory cells in the selected block and first and second select memory cells SMO, SME are set in the erase state (ST11).

After this, the first select memory cell SMO and second select memory cell SME are selectively written to permit one of the two NAND strings connected to each bit line in the selected block to be freely selected.

Figure 12:
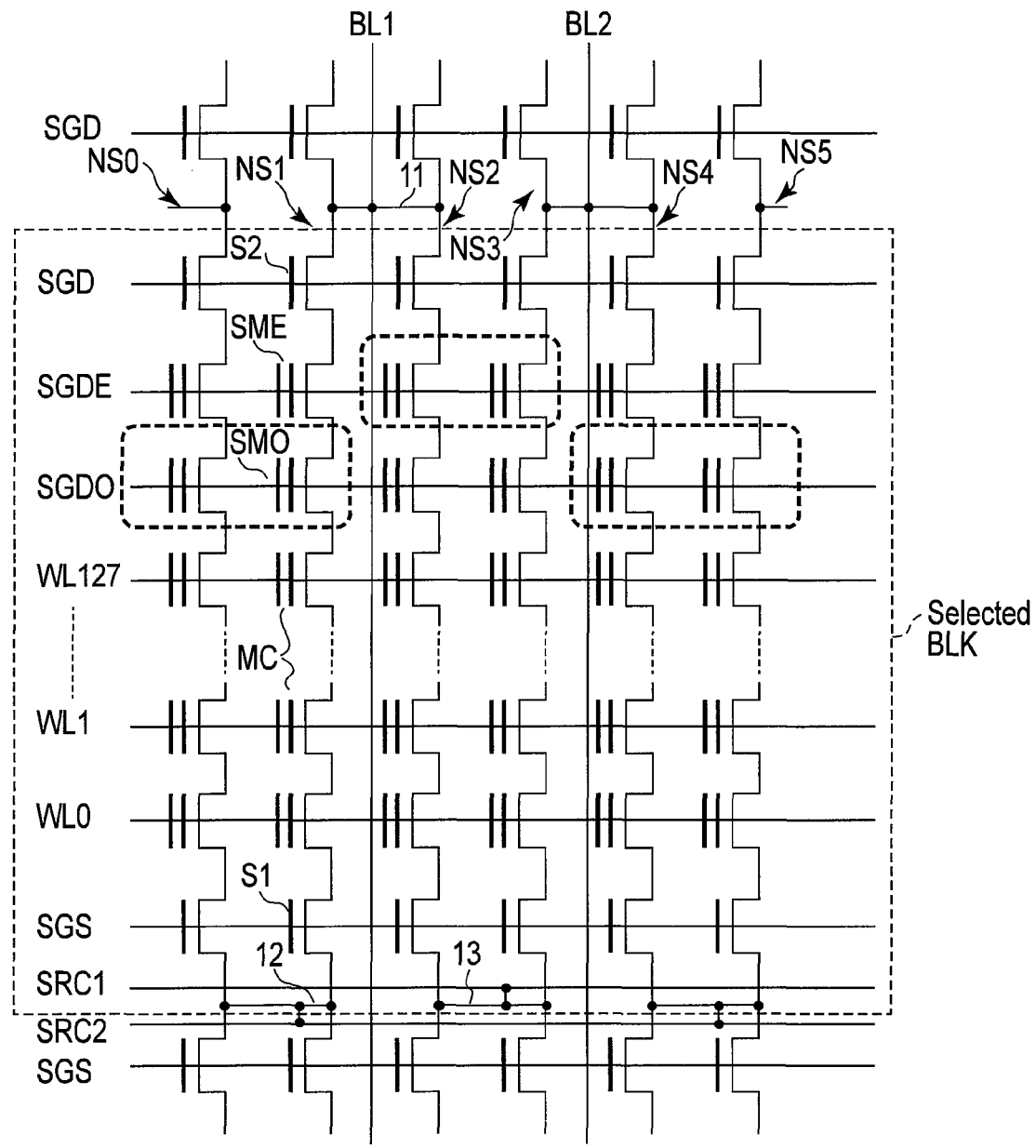
FIG. 12 is a circuit diagram showing select memory cells set in a written state according to the first embodiment.

For example, if the two NAND strings connected to one bit line BL shown in FIG. 12 are defined as first NAND string NS1 and second NAND string NS2, first select memory cell SMO of first NAND string NS1 is set in the written state, second select memory cell SME thereof is set in the non-written state, first select memory cell SMO of second NAND string NS2 is set in the non-written state and second select memory cell SME thereof is set in the written state.

Specifically, first and second select memory cell SME of second NAND string NS2 in the selected block is selectively written to enhance the threshold voltage. At this time, it is supposed that first select memory cell SMO is set in the non-written state. Further, first select memory cell SMO and second select memory cell SME of first NAND string NS1 are also set in the non-written state (ST12). Therefore, first source line SRC1 is set to, for example, Vss (ground voltage), second source line SRC2 is set to Vdd (power source voltage), select line SGD is set to Vss, select line SGS is set to VSGD (Vdd+Vth: Vth is the threshold voltage of the MOS transistor), select line SGDE connected to second select memory cell SME is set to Vpgm (program voltage), select line SGDO connected to first select memory cell SMO is set to Vpass (intermediate voltage) and word lines WL0 to WL127 are set to Vpass to write second select memory cell SME.

Next, first select memory cell SMO of first NAND string NS1 in the selected block is selectively written to enhance the threshold voltage. At this time, it is supposed that second select memory cell SME is set in the non-written state. Further, first select memory cell SMO and second select memory cell SME of second NAND string NS2 are also set in the non-written state (ST13). Therefore, first source line SRC1 is set to Vdd, second source line SRC2 is set to Vss, select line SGD is set to Vss, select line SGS is set to VSGD, select line SGDE connected to second select memory cell SME is set to Vpass, select line SGDO connected to first select memory cell SMO is set to Vpgm and word lines WL0 to WL127 are set to Vpass to write first select memory cell SMO.

The threshold voltages of second select memory cell SME of second NAND string NS2 and first select memory cell SMO of first NAND string NS1 that are written are set to threshold level LMV shown in FIG. 10A or more, for example.

In FIG. 12, first and second select memory cells SMO, SME surrounded by broken lines are set in the written state and the other first and second select memory cells SMO, SME are set in the non-written state (erase state). That is, every two of first and second select memory cells SMO, SME are alternately written in the row direction.

One of the two NAND strings connected to one bit line can be selected according to the potentials of select lines SGDO, SGDE by thus setting the threshold voltages of first and second select memory cells SMO, SME.

In this embodiment, the select memory cells are erased at the erase time of the selected block and then the write operation is performed. However, the write operation can be performed for the select memory cells of the blocks to set the preset threshold voltage of the memory cells before shipment and the threshold voltages of the select memory cells can be inhibited from being erased at the block erase time after shipment. If the above operation is performed, it is possible to omit the write operation with respect to the select memory cells at the erase time of each block.

In a case where the select memory cells of the blocks are written to have the preset threshold voltage in the process before shipment and the threshold voltages of the select memory cells are inhibited from being erased at the block erase time after shipment, the threshold voltages of the select memory cells are checked at the erase time of each block and if the threshold voltage is not set at a preset level, the select memory cell may be erased and written to set the threshold voltage of the select memory cell to the preset threshold voltage level.

(Program Sequence)

As described above, data writing can be performed with respect to the memory cell after the erase sequence is completed. Data writing is sequentially performed starting from word line WL0 that is set close to first and second source lines SRC1, SRC2 towards word line WL127 set close to the bit line.

One of the two NAND strings connected to one bit line is selected and data is written therein. In this case, memory cells contained in NAND strings NS0, NS1, NS4, NS5, . . . shown in FIG. 12 are defined as odd-numbered memory cells and memory cells contained in NAND strings NS2, NS3, . . . are defined as even-numbered memory cells.

Figure 13:
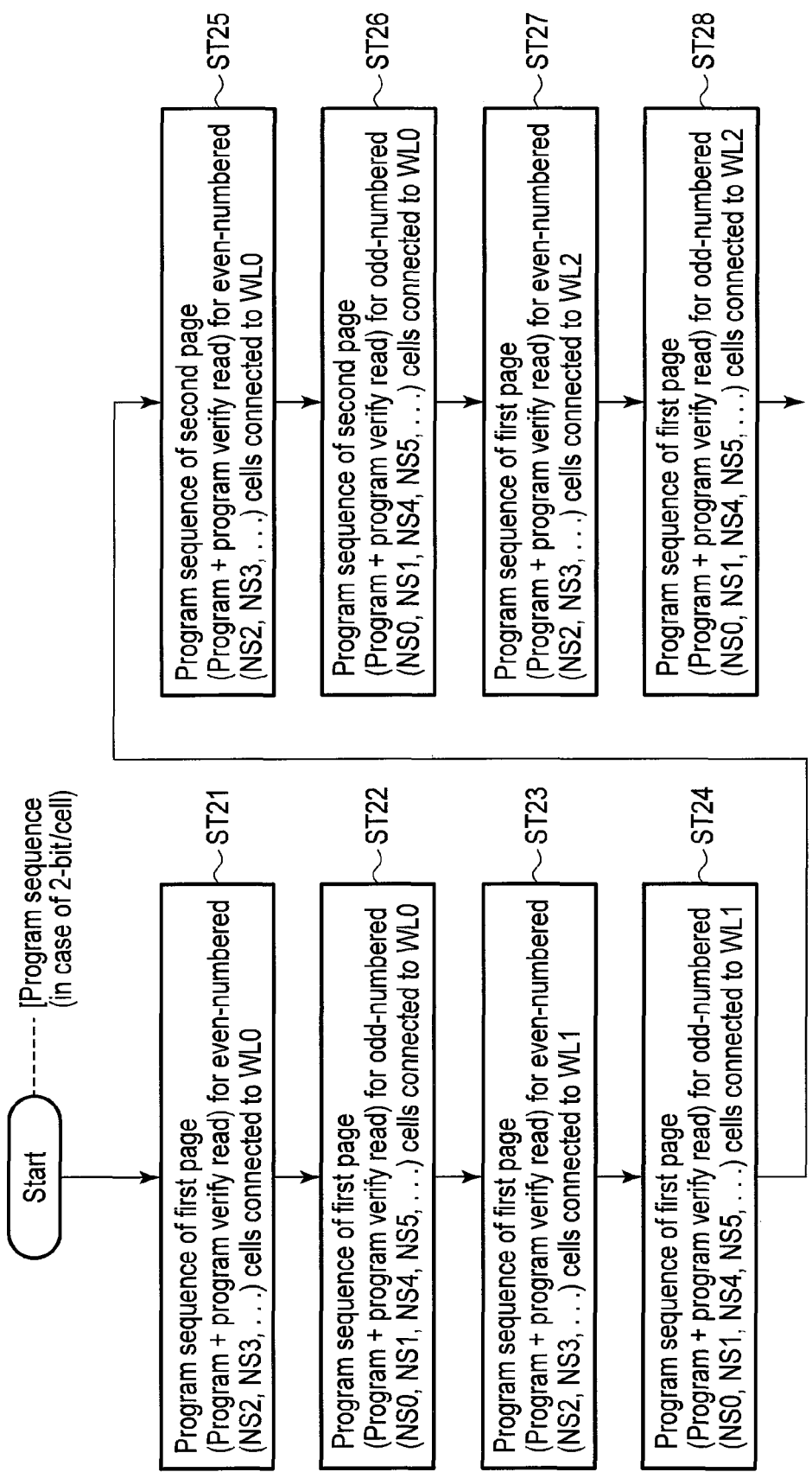
FIG. 13 is a flowchart for schematically illustrating a write sequence according to the first embodiment.

FIG. 13 schematically illustrates the program sequence when two bits are written in one memory cell.

The write operation is performed by taking the coupling capacitance between adjacent memory cells into consideration. Therefore, first, the program sequence of the first page is executed with respect to even-numbered (NS2, NS3, . . . ) memory cells connected to word line WL0 (ST21). The program sequence includes data writing (program) and write verify (program verify read) operations. After writing, the write verify operation is performed. If the write operation is insufficient, the write operation is performed again and the write and write verify operations are repeatedly performed to set a preset threshold voltage in the memory cell.

Next, the program sequence of the first page is executed with respect to odd-numbered (NS0, NS1, NS4, NS5, . . . ) memory cells connected to word line WL0 (ST22). Then, the program sequence of the first page is executed with respect to even-numbered (NS2, NS3, . . . ) memory cells connected to adjacent word line WL1 (ST23). Subsequently, the program sequence of the first page is executed with respect to odd-numbered (NS0, NS1, NS4, NS5, . . . ) memory cells connected to word line WL1 (ST24).

After this, the program sequence of the second page is executed with respect to even-numbered (NS2, NS3, . . . ) memory cells connected to word line WL0 (ST25). Next, the program sequence of the second page is executed with respect to odd-numbered (NS0, NS1, NS4, NS5, . . . ) memory cells connected to word line WL0 (ST26). Then, the program sequence of the first page is executed with respect to even-numbered (NS2, NS3, . . . ) memory cells connected to word line WL2 (ST27). Further, the program sequence of the first page is executed with respect to odd-numbered (NS0, NS1, NS4, NS5, . . . ) memory cells connected to word line WL2 (ST28). Thus, the write operation is controlled.

FIG. 13 shows a case of storing two bits in one memory cell, but when one bit is stored in one memory cell, the program sequence of the first page is executed with respect to odd-numbered (NS0, NS1, NS4, NS5, . . . ) memory cells connected to word line WL2 shown in step ST27 is performed after the write process of steps ST21 to ST24 shown in FIG. 13, for example. That is, the first page is written while skipping over writing of the second page shown in FIG. 13.

By the above operation, one bit can be written in one memory cell.

(Write Sequence of Even-Numbered (NS2, NS3, . . . ) Memory Cells Connected to Word Line WL0)

FIG. 14 shows one example of a write sequence for even-numbered (NS2, NS3, . . . ) memory cells connected to word line WL0.

Data of one page among data to be written in the memory cells is stored in data latch circuit XDL that configures the data storage circuit 10 shown in FIG. 9.

First, the NAND strings in the selected block are charged. (ST21-1).

In this case, select line SGD is set to VSGD, select line SGS is set to Vss, select lines SGDE, SGDO are set to VON (a voltage, for example, Vread that can turn on first and second select memory cells SMO, SME in the written state) and the bit line is set to Vdd.

Next, a to-be-written NAND string containing even-numbered memory cells is connected to the bit line (ST21-2).

In this case, select line SGD is set to VSGD, select line SGS is set to Vss, select line SGDE is set to VON and select line SGDO is set to VOFF (a voltage, for example, Vss that can turn off first and second select memory cells SMO in the written state). The bit line is set to Vdd when write data is 1 and set to Vss when write data is 0.

After this, first source line SRC1 is set to VthD (for example, the threshold voltage of the depletion-type NMOS transistor), second source line SRC2 is set to Vdd, program voltage Vpgm is applied to word line WL0 and Vpass is applied to the non-selected word lines (ST21-3). Thus, data is written in the even-numbered memory cells connected to word line WL0. After this, a program verify operation (not shown) is performed and the write operation is performed again if the voltage is lower than the target threshold voltage.

(Write Sequence of Odd-Numbered (NS0, NS1, NS4, NS5, . . . ) Memory Cells Connected to Word Line WL0)

FIG. 15 shows one example of a write sequence for odd-numbered memory cells connected to word line WL0.

First, the NAND strings in the selected block are charged (ST22-1) like the write operation of the even-numbered memory cells.

In this case, select line SGD is set to VSGD, select line SGS is set to Vss, select lines SGDE, SGDO are set to VON and the bit line is set to Vdd.

Next, a to-be-written NAND string containing odd-numbered memory cells is connected to the bit line (ST22-2).

In this case, select line SGD is set to VSGD, select line SGS is set to Vss, select line SGDE is set to VOFF and select line SGDO is set to VON. The bit line is set to Vdd when write data is 1 and set to Vss when write data is 0.

After this, first source line SRC1 is set to VthD (for example, the threshold voltage of the depletion-type NMOS transistor), second source line SRC2 is set to Vdd, program voltage Vpgm is applied to word line WL0 and Vpass is applied to the non-selected word lines (ST22-3). Thus, data is written in the odd-numbered memory cells connected to word line WL0. After this, a program verify operation (not shown) is performed and the write operation is performed again if the voltage is lower than the target threshold voltage.

(Modification of Program Sequence)

In the case of the program sequence shown in FIG. 13, since the odd-numbered memory cells are written after the even-numbered memory cells are written, there occurs a possibility that the threshold voltage of the even-numbered memory cells that are previously written will vary.

Figure 16:
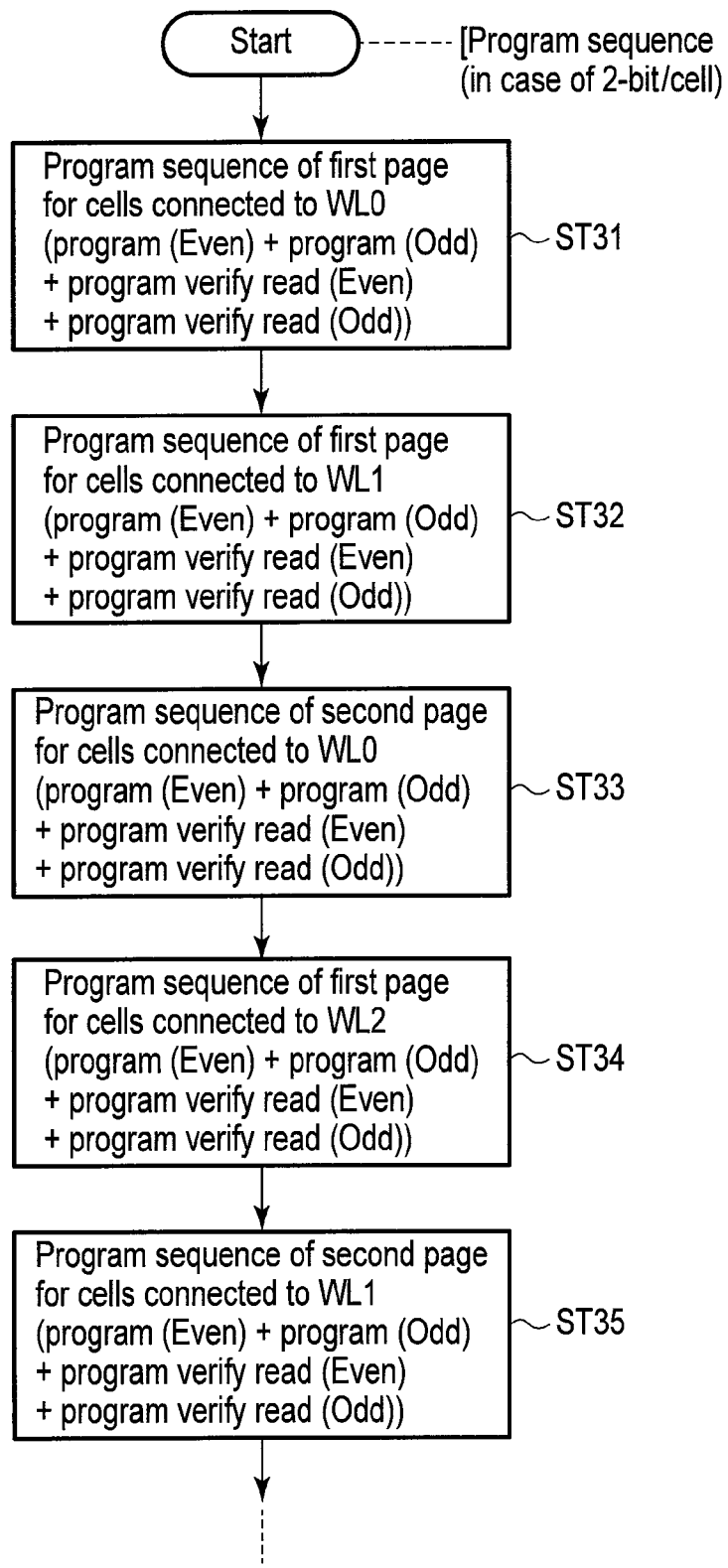
FIG. 16 is a flowchart showing a modification of a program sequence.

FIG. 16 shows a modification of the program sequence in the case of writing two bits in one memory cell.

In this modification, the program operation for even-numbered (NS2, NS3, . . . ) memory cells, the program operation for odd-numbered (NS0, NS1, NS4, NS5, . . . ) memory cells, the program verify read operation for even-numbered (NS2, NS3, . . . ) memory cells and the program verify read operation for odd-numbered (NS0, NS1, NS4, NS5, . . . ) memory cells are performed in one program sequence. Further, the write verify operation is performed after writing, the write operation is performed again if the write operation is insufficiently performed, the write and write verify operations are repeatedly performed to write data of one word line to a preset threshold voltage, and then the program sequence for a next word line is executed.

That is, the program sequence of the first page is executed for the memory cells connected to word line WL0 (ST31) and then the program sequence of the first page is executed for the memory cells connected to word line WL1 (ST32). Next, the program sequence of the second page is executed for the memory cells connected to word line WL0 (ST33) and then the program sequence of the first page is executed for the memory cells connected to word line WL2 (ST34). Further, the program sequence of the second page is executed for the memory cells connected to word line WL1 (ST35).

If the above program sequence is used, the threshold voltage of the memory cells can be prevented from being varied.

FIG. 16 shows the program sequence in the case of writing two bits in one memory cell. However, when one bit is written in one memory cell, the program sequence of the first page is executed for the memory cells connected to word line WL2 shown in step ST34 after steps ST31, ST32 shown in FIG. 16 are performed, for example.

By the above operation, one bit can be written in one memory cell.

(Read Operation)

Figures 17A, 17B:
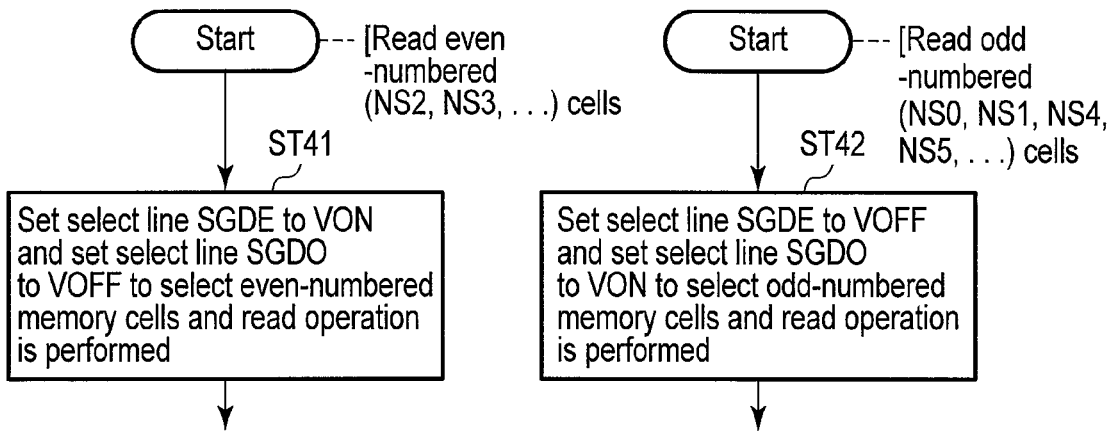
FIGS. 17A and 17B are flowcharts for schematically illustrating a read operation according to the first embodiment.

FIGS. 17A and 17B illustrate a read operation.

Like the write operation, in the read operation, data items in even-numbered memory cells and odd-numbered memory cells connected to the word line are separately read.

As shown in FIG. 17A, when data of the even-numbered memory cells is read, select lines SGD, SGS are set to VSG, select line SGDE is set to VON, select line SGDO is set to VOFF and preset potential VBL is applied to the bit line. Further, first and second source lines SRC1, SRC2 are both set to VSRC (for example, 1 V). At this time, as shown in FIGS. 10A and 10B, the selected word line is set to one of read levels of LMR, AR, BR, CR according to to-be-read data. Further, the non-selected word line is set to Vread and the read operation is performed (ST41).

When the threshold voltage of the memory cell is lower than the level of the word line, the memory cell is turned on and the potential of the bit line is set to the low level. When the threshold voltage of the memory cell is higher than the level of the word line, the memory cell is turned off and the potential of the bit line is held at the high level. The voltage of the bit line is read by the data storage circuit 10.

On the other hand, when data of the odd-numbered memory cells is read, select lines SGD, SGS are set to VSG, select line SGDE is set to VOFF, select line SGDO is set to VON and preset potential VBL is applied to the bit line. Further, first and second source lines SRC1, SRC2 are both set to VSRC. At this time, as shown in FIGS. 10A and 10B, the selected word line is set to one of read levels of LMR, AR, BR, CR according to to-be-read data. Further, the non-selected word line is set to Vread and the read operation is performed (ST42).

As described above, data of the even-numbered and odd-numbered memory cells is read.

According to the first embodiment, adjacent two NAND strings are connected to the bit line through one via. Therefore, the number of vias can be reduced and adjacent two NAND strings can be connected to the bit line even when the cell is miniaturized.

Further, each NAND string includes first and second select memory cells SMO, SME. Therefore, one of the adjacent two NAND strings can be set in the selected state and the other NAND string can be set in the non-selected state by the first and second select memory cells SMO, SME and one or the other of the two NAND strings can be selected.

Further, one of the adjacent two NAND strings is connected to the first source line and the other NAND string is connected to the second source line. Therefore, first and second select memory cells SMO, SME of the adjacent two NAND strings can be selectively written.

As shown in FIG. 13, first and second NAND strings NS1, NS2 are alternately selected and data is sequentially written in the memory cells from the memory cells on the side of source lines SRC1, SRC2. Therefore, the threshold voltage of the memory cell can be prevented from being varied.

Second Embodiment

Figure 18:
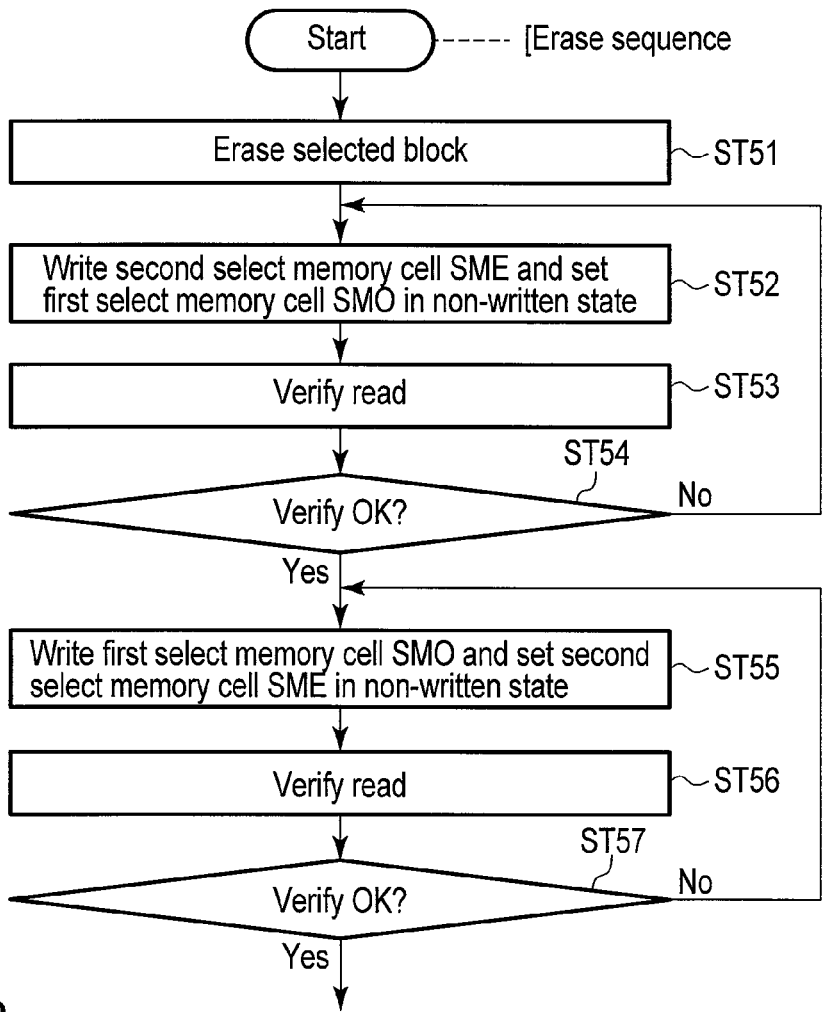
FIG. 18 is a flowchart for illustrating an erase sequence according to a second embodiment.

FIG. 18 shows a second embodiment. The second embodiment shows a modification of an erase sequence.

In the first embodiment, first and second select memory cells SMO, SME in the selected block are written after the erase operation, but the verify operation is not performed.

In the second embodiment, after first and second select memory cells SMO, SME are written, the verify operation is performed and the distribution range of the threshold voltages of first and second select memory cells SMO, SME is narrowed by repeatedly performing the write and verify operations until the threshold voltages of first and second select memory cells SMO, SME reach the verify level.

That is, as shown in FIG. 18, the selected block is erased (ST51) and second select memory cell SMO is written (ST52). Then, the verify read operation is performed (ST53). Next, whether or not the write operation is sufficiently performed is verified based on read data (ST54). If it is detected as the verify result that second select memory cell SME that is not sufficiently written is present, the above second select memory cell SME is written again (ST52). Thus, the operation of steps ST52, ST53, ST54 is repeatedly performed until the verify result becomes OK.

Specifically, in step ST52, first source line SRC1 is set to Vss, second source line SRC2 is set to Vdd, select line SGD is set to Vss and select line SGS is set to VSGD. Further, the bit line connected to the memory cell to be selected by select line SGDE is set to the low level and the bit line connected to the memory cell to be selected by select line SGDO is set to the high level.

After this, select line SGS is set to Vss from VSGD, select line SGD is set to approximately 0.6 V from Vss and bit line BL is set to Vss. Then, if the bit line corresponding to select line SGDE that sets the non-written state is set to Vdd (data 1) from Vss, second select memory cell SGD connected to the above bit line is turned on and potential Vdd is supplied to the drain of first select memory cell SGDO that is set in the non-written state.

Subsequently, after select line SGD is set to Vss from approximately 0.6 V, select line SGDE is set to Vpgm, select line SGDO is set to Vpass and word lines WL0 to WL127 are set to Vpass. Then, only second select memory cell SME that is connected to the select line SGDE is written.

After this, in step ST53, the verify read operation is performed for second select memory cell SME. The sequence of the verify read operation is the same as that of the read operation.

Next, in step ST54, the result of verify read is determined and second select memory cell SME that is insufficiently written is written.

Further, like the case of second select memory cell SME, first select memory cell SMO is written (ST55) and subjected to the verify read operation (ST56) and the result of verify read is determined (ST57). If it is detected as the determination result that first select memory cell SMO that is not sufficiently written is present, the operation of steps ST55, ST56, ST57 is repeatedly performed.

According to the second embodiment, the verify read operation is performed after first select memory cell SMO and second select memory cell SME are written, and if first or second select memory cell SMO, SME that is not sufficiently written is present, the corresponding memory cell is written again. Therefore, the distribution range of the threshold voltages of first and second select memory cell SMO, SME can be narrowed and first and second select memory cell SMO, SME can be stably selected.

Third Embodiment

Figure 20:
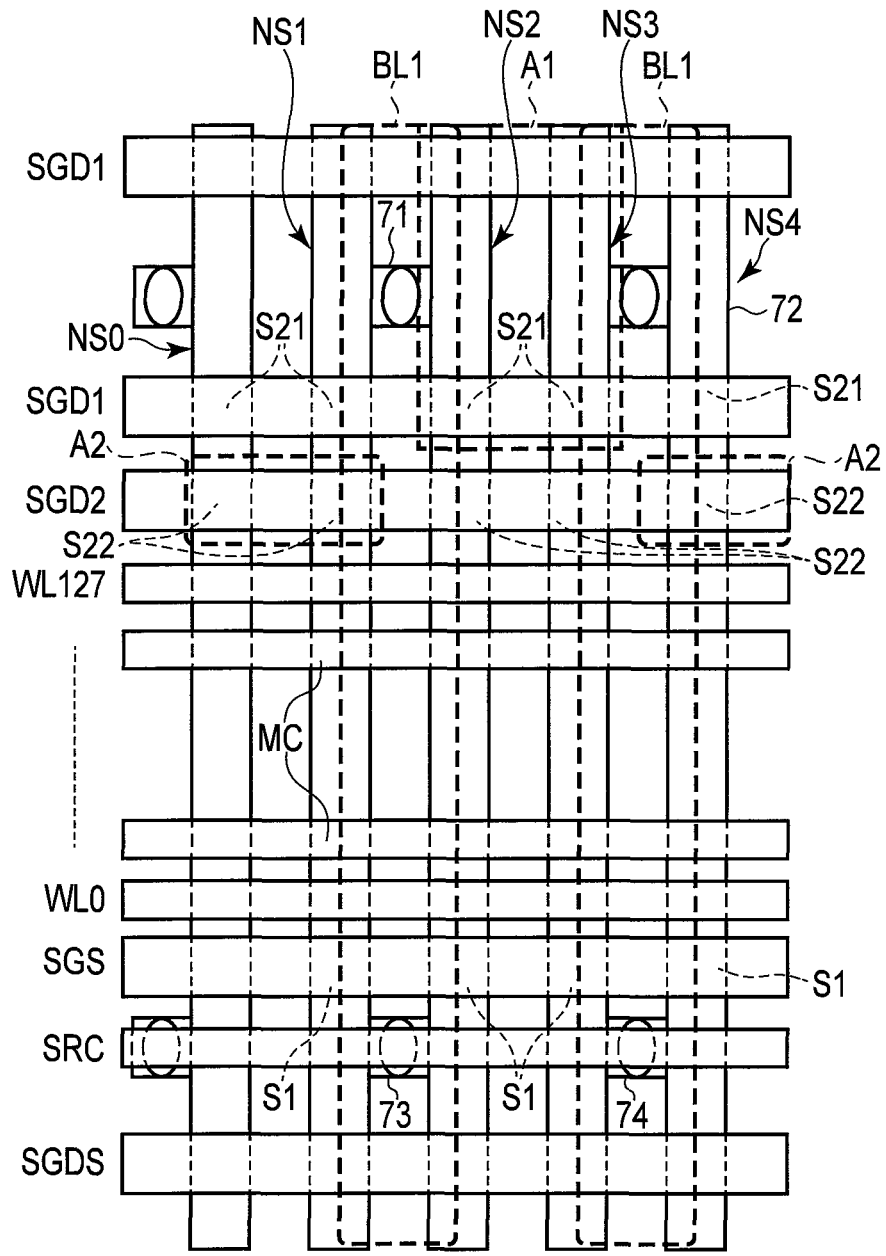
FIG. 20 is a plan view showing a pattern of the circuit shown in FIG. 19.

FIG. 19 and FIG. 20 show a third embodiment.

In the first and second embodiments, first and second select memory cells SMO, SME, select lines SGDO, SGDE and first and second source lines SRC1, SRC2 are provided and even-numbered or odd-numbered memory cells connected to the word line can be selected by selectively writing first and second select memory cells SMO, SME after erasing.

On the other hand, in the third embodiment, as shown in FIG. 19 and FIG. 20, first and second select memory cells SMO, SME, select lines SGDO, SGDE and first and second source lines SRC1, SRC2 are not used and first and second select gates S21, S22 used as select gate S2 that connects the bit line to the NAND string and first and second select lines SGD1, SGD2 connected to first and second select gates S21, S22 are provided and one source line SRC is further provided.

For example, two NAND strings NS1, NS2 adjacent to bit line BL1 are connected to the bit line in a connecting portion 71 that connects the drain of first select gates S21, S21 thereof. Further, for example, two NAND strings NS3, NS4 adjacent to bit line BL2 are connected to bit line BL2 in a connecting portion 72 that connects the drain of first select gates S21, S21 thereof.

The source of two select gates S1, S1 that connect source line SRC used as the cell source to NAND strings NS1, NS2 are connected in a connection portion 73. The connecting portion 73 is connected to source line SRC. Further, the source of two select gates S1, S1 that connect source line SRC to NAND strings NS3, NS4 are connected in a connection portion 74. The connecting portion 74 is connected to source line SRC.

First and second select gates S21, S22 provided in the respective NAND strings are formed to have an enhancement type (E-type) and depletion type (D-type) by ion-implantation. That is, first and second select gates S21, S22 surrounded by broken lines shown in FIG. 19 and FIG. 20 are of the E-type and the other first and second select gates S21, S22 are of the D-type.

Further, the broken lines shown in FIG. 19 and FIG. 20 show openings of a mask used for ion-implantation. First opening A1 corresponds to first select gate S21 and second opening A2 corresponds to second select gate S22. First opening A1 also corresponds to first select gate S21 of an adjacent block and has an area larger than that of second opening A2.

When attention is paid to a plurality of first and second select gates S21, S22 connected to first and second select lines SGD1, SGD2, it is understood that every two of the D-type and E-type of a plurality of first select gates S21 connected to first select line SGD1 are alternately arranged in a row direction. Further, every two of the D-type and E-type of a plurality of second select gates S22 connected to second select line SGD2 are alternately arranged in the row direction.

When attention is paid to a plurality of first and second select gates S21, S22 contained in two NAND strings NS1, NS2 connected to bit line BL1, it is understood that first select gate S21 of NAND string NS1 is of the D-type and second select gate S22 is of the E-type. Further, first select gate S21 of NAND string NS2 is of the E-type and second select gate S22 is of the D-type.

With the above configuration, if first select line SGD1 is set to the low level and second select line SGD2 is set to the high level, second select gate S22 of the E-type connected to second select line SGD2 is turned on. Further, since first select gate S21 of the D-type connected to first select line SGD1 is set in the on state, NAND string NS1 is connected to bit line BL1 and NAND string NS4 is connected to bit line BL2.

Further, if first select line SGD1 is set to the high level and second select line SGD2 is set to the low level, first select gate S21 of the E-type connected to first select line SGD1 is turned on. Further, since second select gate S22 of the D-type connected to second select line SGD2 is set in the on state, NAND string NS2 is connected to bit line BL1 and NAND string NS3 is connected to bit line BL2.

Thus, one or the other of the two NAND strings connected to one bit line can be selectively connected to the bit line by first and second select lines SGD1, SGD2 by arranging first and second select gates S21, S22 of the D-type and E-type.

According to the third embodiment, the drain of adjacent NAND strings NS1, NS2 are connected by the connecting portion 71, the drain of adjacent NAND strings NS3, NS4 are connected by the connecting portion 72, the connecting portion 71 is connected to bit line BL1 and the connecting portion 72 is connected to bit line BL2. Therefore, even when the device is miniaturized, the number of bit line contacts can be suppressed from being increased.

Further, every two of a plurality of first select gates S21 connected to first select line SGD1 and a plurality of second select gates S22 connected to second select line SGD2 are alternately set to the D-type and E-type in the row direction and first and second select gates S21, S22 used for selecting two NAND strings connected to one bit line are alternately set to the D-type and E-type. Therefore, two NAND strings connected to one bit line can be selected without writing first and second select gates S21, S22 after erasing. Therefore, the erase sequence can be simplified.

Fourth Embodiment

Figure 21:
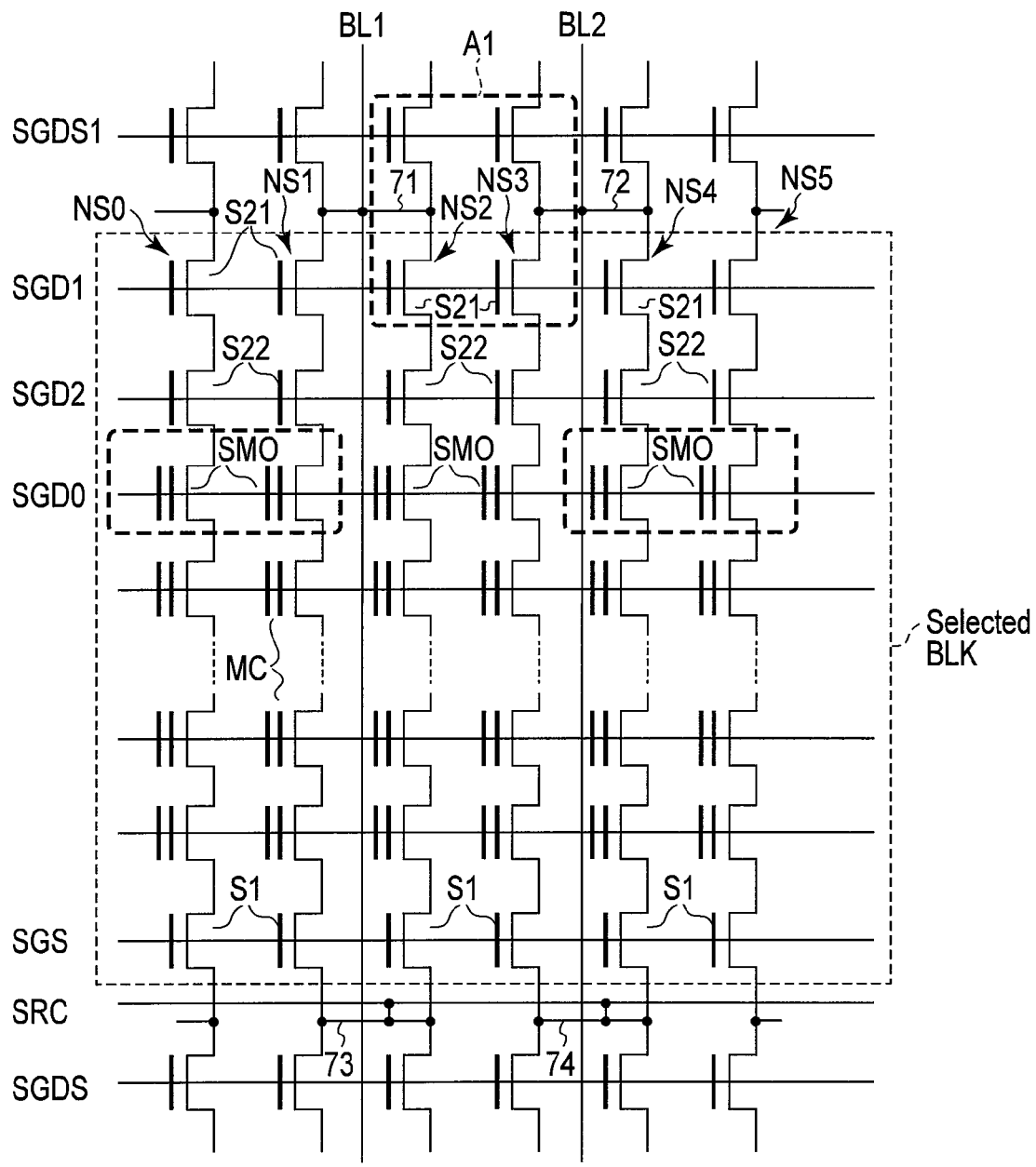
FIG. 21 is a circuit diagram showing an extracted portion of a memory cell array according to a fourth embodiment.
Figure 22:
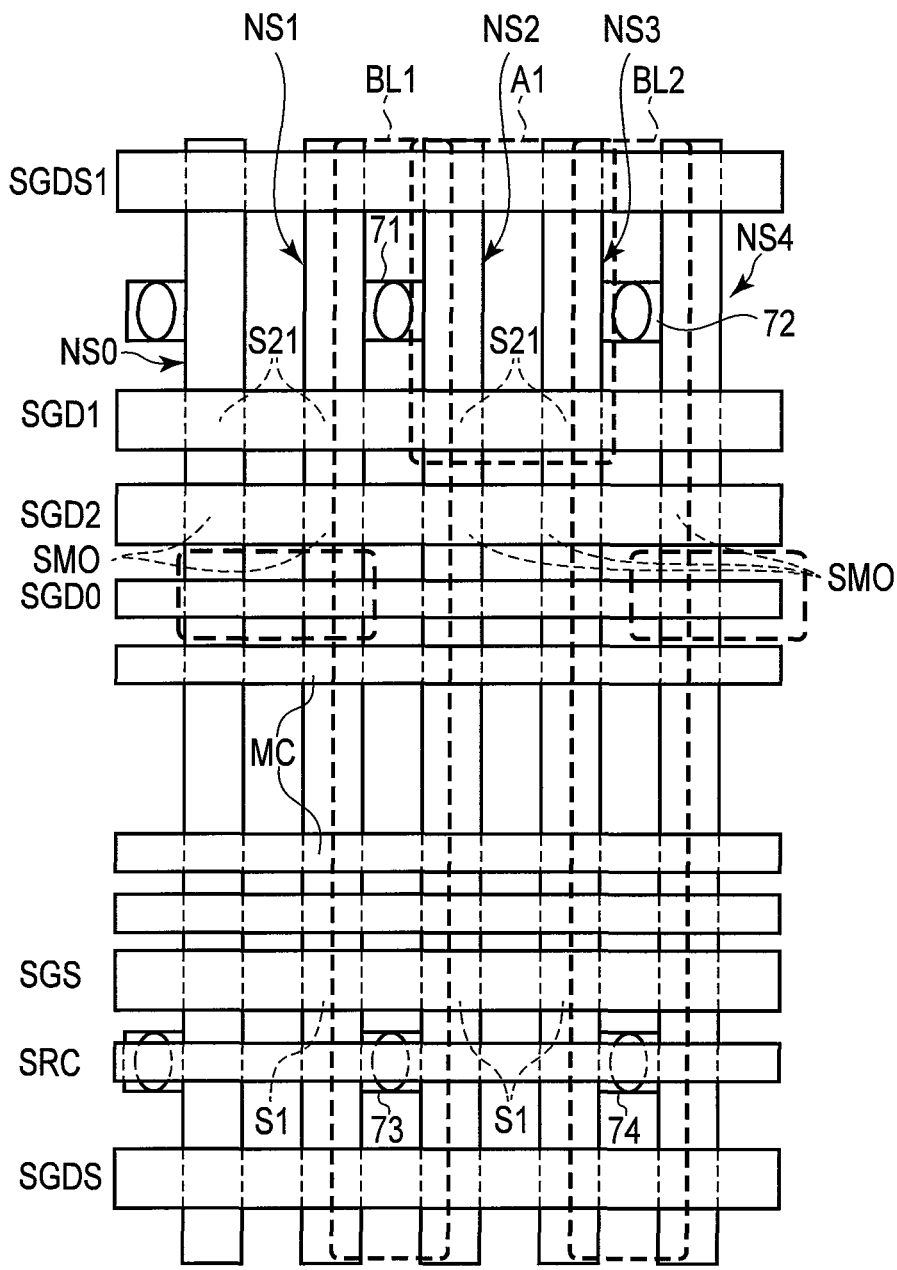
FIG. 22 is a plan view showing a pattern of the circuit shown in FIG. 21.

FIG. 21 and FIG. 22 show a fourth embodiment.

In the case of the third embodiment, first and second select gates S21, S22 are formed to have the E-type and D-type by ion-implantation using a mask. As described before, second opening A2 for second select gate S22 is formed to have an area smaller than that of first opening A1 for first select gate S21. Therefore, the number of lithography steps is increased and the manufacturing cost is increased.

Therefore, as shown in FIG. 21 and FIG. 22, in the fourth embodiment, first select gate S21 of one of the two NAND strings connected to one bit line is formed with the E-type and the other first select gates S21 and second select gates S22 are formed with the D-type.

Further, as shown in FIG. 21 and FIG. 22, first select memory cells SMO connected to select line SGDO are provided. As shown in the first and second embodiments, first select memory cells SMO are written two at a time in the row direction after erasing and the threshold voltages thereof are set. In FIG. 21 and FIG. 22, first select memory cells SMO surrounded by broken lines indicate written memory cells. That is, data is written in first select memory cell SMO of the NAND string in which first select gate S21 is not set to the E-type among the two NAND strings connected to one bit line.

With the above configuration, if select line SGD1 is set to the high level and select lines SGD2, SGD0 are set to the low level, first select gate S21 of the E-type is turned on and first select memory cell SMO that is written is turned off. Therefore, NAND string NS2 is connected to bit line BL1 and NAND string NS3 is connected to bit line BL2.

Further, if select line SGD1 is set to the low level and select lines SGD2, SGD0 are set to the high level, first select gate S21 of the E-type is turned off and first select memory cell SMO that is written is turned on. Therefore, NAND string NS1 is connected to bit line BL1 and NAND string NS4 is connected to bit line BL2.

According to the fourth embodiment, since opening A2 for second select gate S22 becomes unnecessary, the lithography process can be simplified and the manufacturing cost can be reduced.

Further, since the number of source lines can be reduced to one, the chip area can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first NAND string including a plurality of memory cells and first and second select memory cells whose source and drain are serially connected,
    a second NAND string including a plurality of memory cells and third and fourth select memory cells whose source and drain are serially connected, the third select memory cell being selected at a same time as the first select memory cell and having a threshold voltage different from a threshold voltage of the first select memory cell, and the fourth select memory cell being selected at a same time as the second select memory cell and having a threshold voltage different from a threshold voltage of the second select memory cell,
    a bit line arranged in correspondence to the first and second NAND strings,
    a first source line connected to the second NAND string, a second source line connected to the first NAND string, and a plurality of word lines that select plural memory cells arranged in a row direction from among the plurality of memory cells, wherein the first NAND string is selected by the first to fourth select memory cells and data is written in a first memory cell of the first NAND string, then the second NAND string is selected by the first to fourth select memory cells and data is written in a second memory cell of the second NAND string, then a verify read operation is performed for the first memory cell, then a verify read operation is performed for the second memory cell, and then if it is detected as a verify read result that the memory cell is insufficiently written, data is written again in the first memory cell of the first NAND string and in the second memory cell of the second NAND string at a write time, and the bit line is arranged between the first and second NAND strings and connected to the first and second NAND strings.

2. The device according to claim 1, wherein the first source line is set at a first voltage, the second source line is set at a second voltage that is lower than the first voltage, and a program voltage is applied to a selected word line at the write time of the first NAND string.

3. The device according to claim 2, wherein the first source line is set at the second voltage, the second source line is set at the first voltage, and a program voltage is applied to a selected word line at the write time of the second NAND string.

4. A semiconductor memory device comprising:

a first NAND string including a plurality of memory cells and first and second select memory cells whose source and drain are serially connected, a second NAND string including a plurality of memory cells and third and fourth select memory cells whose source and drain are serially connected, the third select memory cell being selected at a same time as the first select memory cell and having a threshold voltage different from a threshold voltage of the first select memory cell, and the fourth select memory cell being selected at a same time as the second select memory cell and having a threshold voltage different from a threshold voltage of the second select memory cell, a bit line arranged in correspondence to the first and second NAND strings, a first source line connected to the second NAND string, a second source line connected to the first NAND string, and a plurality of word lines that select plural memory cells arranged in a row direction from among the plurality of memory cells, wherein the first NAND string is selected by the first to fourth select memory cells and data is written in a first memory cell of the first NAND string, then the second NAND string is selected by the first to fourth select memory cells and data is written in a second memory cell of the second NAND string, then a verify read operation is performed for the first memory cell, then a verify read operation is performed for the second memory cell, then if it is detected as a verify read result that the memory cell is insufficiently written, data is written again in the first memory cell of the first NAND string and in the second memory cell of the second NAND string, and then data is written in a third memory cell adjacent to the first memory cell of the first NAND string and data is written in a fourth memory cell adjacent in a bit line direction to the third memory cell in the second NAND string at a write time, the bit line is arranged between the first and second NAND strings and connected to the first and second NAND strings, the first source line is set at a first voltage, the second source line is set at a second voltage that is lower than the first voltage, and a program voltage is applied to a selected word line at the write time of the first NAND string, and the first source line is set at the second voltage, the second source line is set at the first voltage, and a program voltage is applied to a selected word line at the write time of the second NAND string.

* * * * *